US009908986B2

(12) United States Patent
Rocktäschel

(10) Patent No.: US 9,908,986 B2
(45) Date of Patent: *Mar. 6, 2018

(54) MODIFIED CARBONIZED RED MUD

(71) Applicant: FLUORCHEMIE GMBH FRANKFURT, Frankfurt (DE)

(72) Inventor: Christian Rocktäschel, Bergheim (DE)

(73) Assignee: FLUORCHEMIE GMBH FRANKFURT, Frankfurt (DE)

( * ) Notice: Subject to any disclaimer, the term of this patent is extended or adjusted under 35 U.S.C. 154(b) by 171 days.

This patent is subject to a terminal disclaimer.

(21) Appl. No.: 14/762,412

(22) PCT Filed: Jan. 16, 2014

(86) PCT No.: PCT/DE2014/000013
§ 371 (c)(1),
(2) Date: Jul. 21, 2015

(87) PCT Pub. No.: WO2014/114283
PCT Pub. Date: Jul. 31, 2014

(65) Prior Publication Data
US 2015/0353831 A1 Dec. 10, 2015

(30) Foreign Application Priority Data
Jan. 22, 2013 (DE) .................. 10 2013 001 520

(51) Int. Cl.
C08K 3/34 (2006.01)
C09K 21/02 (2006.01)
(Continued)

(52) U.S. Cl.
CPC ........... C08K 3/0058 (2013.01); C01F 7/066 (2013.01); C04B 18/0409 (2013.01); C05D 3/02 (2013.01);
(Continued)

(58) Field of Classification Search
None
See application file for complete search history.

(56) References Cited
U.S. PATENT DOCUMENTS 2,750,279 A * 6/1956 La Lande, Jr. ........... C21C 1/00
420/29
2,776,205 A * 1/1957 La Lande, Jr. ......... C01G 49/10
252/1
(Continued)

FOREIGN PATENT DOCUMENTS

CA 02829312 A1 9/2012
CN 1414056 A 4/2003
(Continued)

OTHER PUBLICATIONS

Oct. 1, 2014—(WO) International Search Report—APP PCT/DE2014/000013.
(Continued)

Primary Examiner — Joseph D Anthony
(74) Attorney, Agent, or Firm — Banner & Witcoff, Ltd.

(57) ABSTRACT

The present disclosure relates to an inorganic, halogen-free flameproofing agent produced from modified, carbonized red mud (MKRS-HT) having, in some examples, a mineral composition of 10 to 50 weight % of iron compounds, 12 to 35 weight % of aluminum compounds, 5 to 17 weight % of silicon compounds, 2 to 10 weight % of titanium dioxide, 0.5 to 6 weight % of calcium compounds, the weight ratio of Fe (II) carbonate to the oxides of iron being at least 1. Examples of the agent can be used as a flame retardant in the high-temperature range. The disclosure further relates to an agent produced from modified, carbonized and rehydrated red mud, which can be used as a flame retardant in the low-temperature and high-temperature ranges, methods for producing same and use as flame retardants. The disclosure
(Continued)

further relates to a flameproofed material system and methods for producing same.

19 Claims, 8 Drawing Sheets

(51) Int. Cl.

| | | |
|---|---|---|
| *C09K 5/14* | (2006.01) | |
| *G10K 11/165* | (2006.01) | |
| *H05K 9/00* | (2006.01) | |
| *F16L 59/02* | (2006.01) | |
| *C08K 3/00* | (2018.01) | |
| *C08J 9/00* | (2006.01) | |
| *C05D 3/02* | (2006.01) | |
| *G10K 11/162* | (2006.01) | |
| *G21F 1/06* | (2006.01) | |
| *G21F 1/04* | (2006.01) | |
| *G21F 1/10* | (2006.01) | |
| *C09K 8/03* | (2006.01) | |
| *C01F 7/06* | (2006.01) | |
| *C05D 9/02* | (2006.01) | |
| *C05F 7/00* | (2006.01) | |
| *C04B 18/04* | (2006.01) | |
| *C08K 11/00* | (2006.01) | |
| *C04B 103/63* | (2006.01) | |

(52) U.S. Cl.
CPC .............. *C05D 9/02* (2013.01); *C05F 7/005* (2013.01); *C08J 9/0066* (2013.01); *C08K 3/346* (2013.01); *C08K 11/005* (2013.01); *C09K 5/14* (2013.01); *C09K 8/03* (2013.01); *C09K 8/032* (2013.01); *C09K 21/02* (2013.01); *F16L 59/028* (2013.01); *G10K 11/162* (2013.01); *G10K 11/165* (2013.01); *G21F 1/042* (2013.01); *G21F 1/06* (2013.01); *G21F 1/103* (2013.01); *H05K 9/0081* (2013.01); *C01P 2002/72* (2013.01); *C01P 2002/88* (2013.01); *C01P 2006/12* (2013.01); *C04B 2103/63* (2013.01); *C08J 2323/08* (2013.01); *Y02W 30/91* (2015.05)

(56) References Cited

U.S. PATENT DOCUMENTS

| 4,226,838 A * | 10/1980 | Boros ................. B01J 23/02 423/121 |
| 4,579,722 A * | 4/1986 | Csikos ................. C01F 7/066 423/120 |
| 6,248,302 B1 | 6/2001 | Barnett et al. |
| 9,487,636 B2 * | 11/2016 | Rocktaschel ........ C08K 3/0058 |
| 2003/0041785 A1 * | 3/2003 | Harrison ................. C04B 28/04 106/801 |
| 2013/0345351 A1 | 12/2013 | Rocktaschel et al. |

FOREIGN PATENT DOCUMENTS

| CN | 101423306 A | 5/2009 |
| CN | 101624457 A | 1/2010 |
| CN | 102050984 A | 5/2011 |
| CN | 102070815 A | 5/2011 |
| CN | 102585845 A | 7/2012 |
| CN | 102851425 A | 1/2013 |
| DE | 2627504 A1 | 12/1977 |
| FR | 978108 A | 4/1951 |
| JP | S52-051428 A | 4/1977 |
| JP | S54-028347 A | 3/1979 |
| JP | S54-137027 A | 10/1979 |
| JP | S54-141027 A | 11/1979 |
| JP | 57-85854 | 5/1982 |
| JP | H01-106593 U | 7/1989 |
| JP | 07-315830 | 12/1995 |
| JP | H09-506137 A | 6/1997 |
| JP | 09-296116 | 11/1997 |
| JP | 2004-530544 A | 10/2004 |
| JP | 2005-097352 A | 4/2005 |
| JP | 2007-511644 A | 5/2007 |
| JP | 2008-308627 A | 12/2008 |
| JP | 2014-518902 A | 8/2014 |
| SU | 1060656 A1 | 12/1983 |
| SU | 1792951 A1 | 2/1993 |
| WO | 2012126487 A1 | 9/2012 |

OTHER PUBLICATIONS

Dec. 23, 2011—(WO) International Search Report—APP PCT/EP2011/001454.
Oct. 1, 2014—(WO) International Search Report—APP PCT/DE2014/000014.
Sunil K. Sharma et al., Fire Technology, Jan. 1, 2002, pp. 57-70, vol. 38, No. 1.
Yoshikazu Horiguchi et al., Carbonation of aqueous suspension containing red mud, Light Metals, vol. 15, No. 2 (No. 70), pp. 85-91, Mar. 1965.
Sunil K. Sharma et al: Fire Technology. vol. 38. No. 1. Jan. 1, 2002 (Jan. 1, 2002). pp. 57-70. XP55012990. ISSN: 0015-2684. DOI: 10.1023/A:1013428831840 Introduction; Results and Discussion table 1.
Li, Yun et al, Preparation of Ferric Oxide from Iron Mud through Wetting Method, Journal of Shenyang Institute of Chemical Technology, vol. 22, No. 2, pp. 104-106, Jun. 2008.

* cited by examiner

Red mud enriched in goethite content

Red mud with average siderite content

MODIFIED CARBONIZED RED MUD

The present application is a U.S. National Phase of International Application No. PCT/DE2014/000013 filed on Jan. 16, 2014, designating the United States of America and claiming priority to German Patent Application No. 102013001520.0 filed on Jan. 22, 2013. This application claims priority to and the benefit of the above-identified applications, each of which is fully incorporated by reference herein.

FIELD OF THE DISCLOSURE

The present disclosure relates to a modified, carbonised red mud (MKRS-HT) which can be used as a flame retardant in the high-temperature range, as well as modified, carbonised and rehydrated red mud which can be used as a flameproofing agent both in the low-temperature range and also in the high-temperature range, and also relates to methods for producing same.

BACKGROUND OF THE DISCLOSURE

It is known that red mud, which is produced as a waste product in the Bayer process for extracting aluminum hydroxide (ATH) from bauxite. In the following description red mud (RM) is understood to be the residue from the Bayer process which is produced in the extraction of ATH from bauxite.

Red mud (RM), which may to some extent be represented as bauxite minus ATH, is an extremely heterogeneous substance with regard to its chemical and mineralogical composition, its endothermic properties, its pH value, etc. The cause of the heterogeneity sometimes lies in the differing composition the bauxites used, but above all in whether the Bayer process operates by autoclave digestion or by tube digestion. In the autoclave process the digestion is carried out with 30 to 35% caustic soda solution at temperatures of 170-180° C., so that a pressure of 6 to 8 bars is established. The tube digestion process was developed in order to shorten the reaction time of 6 to 8 hours to less than 1 hour by increasing the temperature to 270° C. However, at this temperature a water vapor pressure of 60 bars is established at the end of the reactor. The higher temperatures of the tube digestion also influence the composition of the red mud. For example, in the iron hydroxide/oxide hydroxide system in the tube digestion process the balance is shifted almost completely towards hematite ($Fe_2O_3$). Because of the heterogeneity of the red mud (RM) the economically viable possibilities for use thereof is restricted, so that it must be predominantly disposed of as waste at disposal sites.

In WO 2012/126487 A1 a so-called "zero-halogen flame retardant" (OHFR) system, based upon modified rehydrated red mud (MR2S) is described, which is suitable as a cost-effective OHFR system for technical applications in the wire and cable field or for constructional and plastics processing applications. With the aid of the modified rehydrated red mud disclosed in WO 2012/126487 A1 a flame-retardant effect can be achieved in the temperature range from approximately 200° C.-350° C. The flame-retardant effect comes about due to the fact that the hydroxides and oxide hydroxides of aluminum and iron—such as for example gibbsite and boehmite or goethite—which are produced in the rehydration of the red mud decompose in oxides and water. Such products have applications for example in polymer systems such as PVC or EVA (PE). Products such as ATH or APP hitherto used in the market react between 180° C. and 220° C. and are regarded as low-temperature products. Between 220° C. and 340° C. products such as MDH and brucite are used which are regarded as high-temperature products. The flame retardants (MR2S) produced from RM by rehydration react between approximately 220° C. and 350° C. and thus according to the currently customary definition covers both the low-temperature and the high-temperature range.

BRIEF SUMMARY OF THE DISCLOSURE

An object of the present disclosure is to modify red mud in such a way that a commercially usable more cost-effective basic substance with reproducible characteristics and defined chemical composition is provided.

By reduction of red mud in an acidic medium it is possible to obtain from the Fe (III) compounds present in the red mud Fe (II) salt solutions, from which iron (II) carbonate (siderite) can be precipitated by addition of for example $NaHCO_3$, $Na_2CO_3$ or $CaCO_3$. Without wishing to be tied to a theory, it is assumed that by a recarbonization of red mud with the formation of iron (II) carbonate a high-temperature (HT) flameproofing agent can be obtained which exhibits its endothermic effect by cleavage into oxide and $CO_2$ up to temperatures of more than 500° C. In addition to the endothermic reaction acts the released $CO_2$ acts as a flameproofing agent.

The present disclosure therefore relates to modified, carbonised red mud (MKRS-HT) with, in some examples, a mineral composition of 10 to 50% by weight of iron compounds,
12 to 35% by weight of aluminum compounds,
5 to 17% by weight of silicon compounds,
2 to 10% by weight of titanium dioxide,
0.5 to 6% by weight of calcium compounds, and
where appropriate unavoidable impurities, wherein the weight ratio of Fe (II) carbonate to the oxides of iron is at least 1.

Since this product is produced by recarbonization, it is given the name MKRS (modified carbonised red mud). Since this may be a high-temperature flame retardant, it is given the suffix HT (high-temperature), and thus its designation is MKRS-HT.

The present disclosure further relates to modified, carbonised and rehydrated red mud with, in some examples, a mineral composition of 10 to 50% by weight of iron compounds,
12 to 35% by weight of aluminum compounds,
5 to 17% by weight of silicon compounds,
2 to 10% by weight of titanium dioxide,
0.5 to 6% by weight of calcium compounds, and
where appropriate unavoidable impurities, wherein the weight ratio of Fe (II) carbonate and the weight ratio of the sum of iron hydroxide and iron oxide hydroxide to the oxides of iron is at least 1.

In this case, in addition to the hydroxides/oxide hydroxides of the iron and Fe (II) carbonate, hydroxides/oxide hydroxides of the aluminum are preferably also present which for example can produce a further intensification of the flame-retardant effect on the basis of its endothermic characteristics. In addition, phase transformations into different constituents of the red mud can take effect endothermally. Overall, in polymer compounds equipped with such OHFR products according to examples the disclosure endothermic reactions proceed over a temperature range of 180° C. up to more than 500° C. Additionally flame-retardant $CO_2$ is released.

The present disclosure further relates to a method for producing modified, carbonised red mud (MKRS-HT) comprising, in some examples, the steps of:

a) providing red mud,
b) reducing the iron (III) compounds contained in the red mud in acidic solution to iron (II) compounds, c) adding a carbonate compound to the solution containing iron (II) compounds obtained in step b), wherein iron (II) carbonate (siderite) is formed.

The present disclosure further relates to a fireproofed material system, comprising, in some examples, a combustible material and a modified red mud according to the disclosure.

The present disclosure further relates to the use of a modified red mud according to the disclosure as flameproofing agent or flame retardant for combustible materials, in particular combustible building materials, rubber, chipboard material, plastics, in particular cable sheathings, cable insulation compound or cable filling compounds.

The present disclosure further relates to a method for producing a fireproofed material system comprising, in some examples, the steps of:
  a) providing a combustible material,
  b) coating or blending the combustible material with modified red mud according to the disclosure, and thereby
  c) obtaining the fireproofed material system.

Furthermore it has been found that chemically modified, rehydrated and carbonised red mud as well as mixtures thereof has a density of approximately 3.8-3.9 $10^3$ kg/m$^3$ and thus close to BaSO$_4$ (barite), which has a density of 4.43 $10^3$ kg/m$^3$. Because of its specific weight BaSO$_4$ is also used inter alia as a heavy filler in plastics. According to the disclosure chemically modified red mud MR2S-LT or MKRS-HT or mixtures thereof can be used instead of barite.

Furthermore chemically modified, rehydrated and carbonised red mud, as well as mixtures thereof in conjunction with a carrier matrix exhibit a sound-insulating effect. Thus if plastics or for example building materials are provided with these products, in addition to the flame-retardant effect a sound-insulating effect also occurs. This double effect is of particular interest when used in automobile manufacture and the construction industry. Building materials may also be mineral products such as screed, concrete, gypsum plasterboards, etc., which then have a corresponding sound insulation.

DETAILED DESCRIPTION OF THE DISCLOSURE

Figure 1:
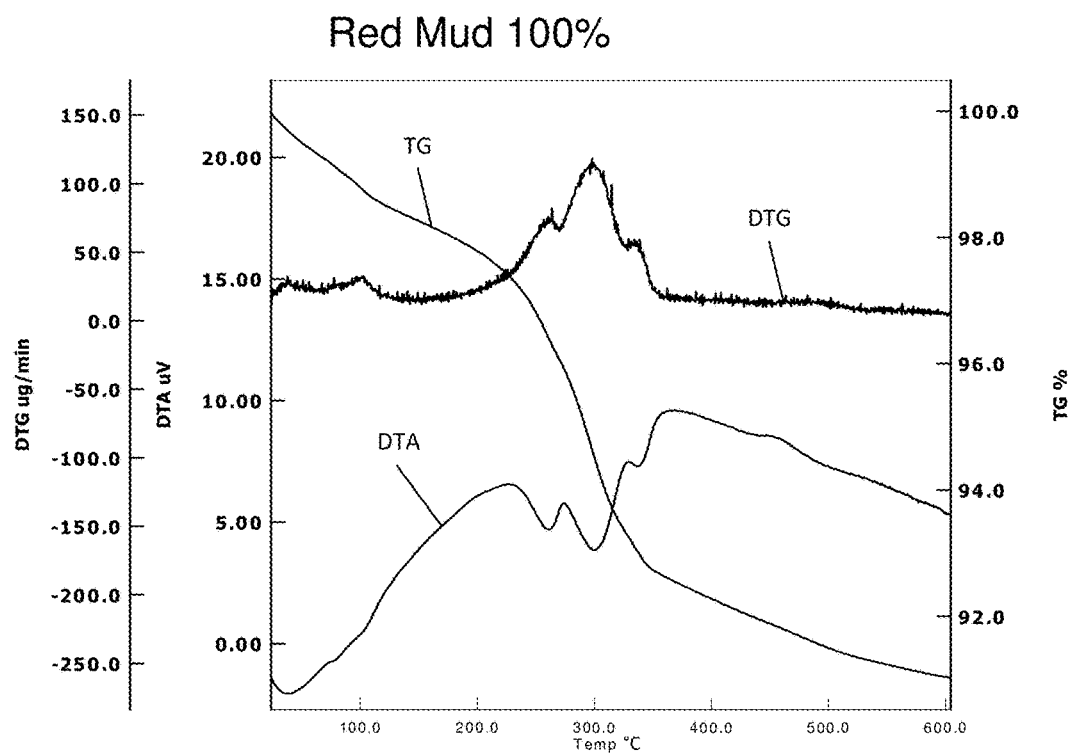
FIG. 1 shows differential thermoanalysis and thermogravimetry curves of an example red mud.

The terms "flameproofing agent", "flame-retardant agent", "flame retardant" and "OHFR agents" or also the abbreviation "FR" (English: flame retardant) should be understood as synonyms in the present description. These are understood within the context of the present disclosure to include in particular non-toxic, halogen-free inorganic flameproofing agents.

In the present description the "low-temperature range" is understood to be the temperature range between 220° C. and 350° C.

In the present description the "high-temperature range" is understood to be the temperature range between 350° C. and 500° C.

The term "fireproofed material system" is understood to mean an object in which a combustible material is brought into contact with a flame-retardant agent so that the ignition of the combustible material present in the object by fire or heat is prevented or slowed down. In particular the flame-retardant agent is permanently associated with the combustible material, for example by blending or coating.

"Combustible materials" or "flammable materials" are understood to be any materials which are combustible or flammable, in particular polymers and non-volatile hydrocarbons. Examples are acrylic dispersions, acrylic resins, elastomers, epoxy resins, latex dispersions, melamine resins, polyamide (PA), polyethylene (PE), PE copolymers, thermoplastic PE copolymers, cross-linked PE copolymers, phenolic resins, polyester resins (UP), polyurethane, polypropylene (PP), polyvinyl chloride (PVC), PVC plastisols, thermoplastic elastomers such as for example TPE, TPA, TPU, etc., vinyl ester resins and bitumen. "Combustible" and "flammable" should be understood here as synonyms.

Red mud (RM) is understood to be the residue from the Bayer process which is produced in the extraction of ATH from bauxite. Further information concerning red mud may be found in WO 2012/126487 A1, the disclosure of which is hereby incorporated as an integral part of this application. Modified carbonised red mud (MKRS-HT) is understood to be a product which is produced from red mud (RM) by recarbonization and optionally drying, grinding, admixture of other substances, coating of the surface, etc. Modified carbonised and rehydrated red mud is understood to be a product which is produced from red mud (RM) by recarbonization as well as rehydration and optionally drying, grinding, admixture of other substances, coating of the surface, etc.

The present disclosure relates to an inorganic, halogen-free flameproofing agent produced from modified, carbonised red mud (MKRS-HT) with a mineral composition, in some examples, of
  10 to 50% by weight of iron compounds,
  12 to 35% by weight of aluminum compounds,
  5 to 17% by weight of silicon compounds,
  2 to 10% by weight of titanium dioxide,
  0.5 to 6% by weight of calcium compounds, and
  where appropriate unavoidable impurities,
wherein the weight ratio of Fe (II) carbonate to the oxides of iron is at least 1.

In the inorganic, halogen-free flameproofing agent produced from modified, recarbonized red mud (MKRS-HT) the weight ratio of Fe (II) carbonate to the oxides of iron is preferably at least 1, more preferably at least 2, more preferably at least 3, more preferably at least 4, more preferably at least 5, more preferably at least 7, more preferably at least 9, more preferably at least 19. For clarification, if for example the weight ratio of Fe (II) carbonate to the oxides of iron amounts to 19 and assuming that all the iron compounds are present either as Fe (II) carbonate or as oxides of iron, 95% by weight of the iron compounds are present as Fe (II) carbonate and 5% by weight of the iron compounds are present as oxides of iron.

The present disclosure further relates to an inorganic, halogen-free flameproofing agent produced from modified, carbonised and rehydrated red mud (MKRS-HT/MR2S-NT) with a mineral composition, in some examples, of
10 to 50% by weight of iron compounds,
12 to 35% by weight of aluminum compounds,
5 to 17% by weight of silicon compounds, −2 to 10% by weight of titanium dioxide,
0.5 to 6% by weight of calcium compounds, and
where appropriate unavoidable impurities,
wherein the weight ratio of Fe (II) carbonate and the weight ratio of the sum of iron hydroxide and iron oxide hydroxide to the oxides of iron is at least 1.

In the inorganic, halogen-free flameproofing agent produced from modified, carbonised and rehydrated red mud the weight ratio of Fe (II) carbonate and iron hydroxide/oxide hydroxides to the oxides of iron is preferably at least 1, more preferably at least 2, more preferably at least 3, more preferably at least 4, more preferably at least 5, more preferably at least 7, more preferably at least 9, more preferably at least 19.

For clarification, if for example the weight ratio of Fe (II) carbonate to the oxides of iron amounts to 2 and the weight ratio of the sum of iron hydroxide and iron oxide hydroxide to the oxides of iron also amounts to 2 and assuming that all the iron compounds are present either as Fe (II) carbonate, iron hydroxide, iron oxide hydroxide or as oxides of iron, 40% by weight of the iron compounds are present as Fe (II) carbonate, 40% by weight of the iron compounds are present as iron hydroxide or iron oxide hydroxide and 20% by weight of the iron compounds are present as oxides of iron.

In the inorganic, halogen-free flameproofing agent produced from modified, carbonised and rehydrated red mud, in addition to the hydroxides/oxide hydroxides of the iron and Fe (II) carbonate, hydroxides/oxide hydroxides of the aluminum are preferably also present which can produce a further intensification of the flame-retardant effect on the basis of its endothermic characteristics. In this case the weight ratio of the sum of aluminum hydroxide and aluminum oxide hydroxide to aluminum oxide is preferably at least 1, more preferably at least 1.5, more preferably at least 2, more preferably at least 3, more preferably at least 4, more preferably at least 5, more preferably at least 7, more preferably at least 9, more preferably at least 19.

Unless explicitly noted otherwise, the following statements apply both to the inorganic, halogen-free flameproofing agents produced from modified, carbonised red mud (MKRS-HT) and also to the inorganic, halogen-free flameproofing agents according to the disclosure produced from modified, carbonised and rehydrated red mud (MKRS-HT/MR2S-NT), which taken together are also designated below simply as "modified red mud" or "flameproofing agent (according to the disclosure)".

The mineral composition of the modified red mud comprises:
10 to 50% by weight of iron compounds,
12 to 35% by weight of aluminum compounds,
5 to 17% by weight of silicon compounds,
2 to 10% by weight of titanium dioxide,
0.5 to 6% by weight of calcium compounds, and
where appropriate unavoidable impurities, In this case the mineral composition of the modified red mud may comprise 10 to 45, 30 to 50, or 20 to 40% by weight of iron compounds.

In this case the mineral composition may comprise 12 to 30, 20 to 35, or 15 to 25% by weight of aluminum compounds.

In this case the mineral composition may comprise 5 to 15, 8 to 17, or 7 to 16% by weight of silicon compounds, in particular $SiO_2$.

In this case the mineral composition may comprise 4 to 10, 2 to 8, or 3 to 9% by weight of titanium dioxide ($TiO_2$).

In this case the mineral composition may comprise 1 to 6, 0.5 to 2.5, or 0.6 to 1.5% by weight of calcium compounds, in particular CaO.

In this case each of the ranges given above may be combined.

"Unavoidable impurities" are understood to be constituents which occur as impurities in the starting materials, for example in the bauxite subjected to a Bayer process, or impurities which are produced or introduced in the product due to manufacturing tolerances. In particular due to the heterogeneity of the red mud, as mentioned in the introduction, such impurities are inevitable. However they do not contribute decisively to the flame-retardant effect of the modified red mud.

In a modification of the disclosure the proportion of water-soluble sodium compounds, expressed in percentage by weight of $Na_2O$, in the modified red mud is no more than 0.03, preferably 0.003 to 0.03% by weight.

In a further modification of the disclosure the average particle size (d50) in the modified red mud is no more than 50 μm, preferably 0.5 to 10 μm or 1 to 5 μm (modified red mud on a microscale) or 100 to 900 nm or 200 to 750 nm (modified red mud on a nanoscale).

In a further modification of the disclosure the residual moisture content of the modified red mud amounts to no more than 0.4% by weight, preferably no more than 0.3% by weight, preferably no more than 0.2% by weight.

The chemical composition of red mud is set out in Table 1, the chemical composition of MKRS-HT is set out in Table 2 and the chemical composition of modified, carbonised and rehydrated red mud is set out in Table 3 (MKRSHT/MR2S-NT).

TABLE 1

Red mud (percent by weight)

| | Typical | Bandwidth |
|---|---|---|
| Iron compounds | 40 | 10-50 |
| Aluminum compounds | 25 | 12-35 |
| Silicon compounds (esp. $SiO_2$) | 15 | 5-17 |
| Titanium dioxide | 7 | 2-10 |
| Calcium compounds | 1 | 0.5-6 |
| Sodium compounds | 9 | 3-10 |
| Other | 3 | 0-3 |

TABLE 2

MKRS - HT

| | |
|---|---|
| iron compounds | weight ratio of Fe (II) carbonate to the oxides of iron at least 1 |
| aluminum compounds | unchanged as Al salts or $Al_2O_3$ |
| $Na_2O$ soluble | preferably less than or equal to 0.03% by weight |
| other constituents of the RM | unchanged |
| average particle size (d 50) | preferably less than or equal to 50 μm, preferably 0.5-10 μm |
| residual moisture | preferably less than or equal to 0.4% by weight |

TABLE 3

MKRS-HT/MR2S-NT

| | |
|---|---|
| iron compounds | weight ratio of Fe (II) carbonate and the sum of iron hydroxide and iron oxide hydroxide to the oxides of iron at least 1 |
| aluminum compounds | weight ratio of the sum of aluminum hydroxide and aluminum oxide hydroxide to aluminum oxide preferably at least 1 |
| $Na_2O$ soluble | preferably less than or equal to 0.03% by weight |
| other constituents of the RM | unchanged |
| average particle size (d 50) | preferably less than or equal to 50 μm, preferably 0.5-10 μm |
| residual moisture | preferably less than or equal to 0.4% by weight |

Furthermore it is preferable if the surface of the modified red mud is provided with at least one substance which improves the compatibility of the particles of the modified red mud with a polymer matrix. In this way the incorporation of the modified red mud into the combustible material to be protected, which generally has a polymer matrix, can be simplified and the bonding of the components can be improved. Likewise in this way the characteristic profile of the polymer compound can be controlled in a targeted manner.

In this case it has proved advantageous if the substance is a surface modifying agent, selected from the group consisting of organosilanes, organotitanates, organo-zirconium aluminates, carboxylic acid derivatives, softeners, oligomer and polymer precursors, ionomers, boric acid and the metal salts and derivatives thereof, zinc stannates, zinc hydroxystannates or combinations thereof.

In a further preferred embodiment the flameproofing agent is present in combination with synergists, in particular organoclays (nanoclays), tin compounds and borates.

It is likewise preferable if the flameproofing agent also contains at least one further flame-retardant additive in a proportion up to 70% by weight, preferably 5 to 60% by weight, more preferably 10 to 50% by weight, more preferably 15 to 40% by weight.

A further particularly suitable flame-retardant additive is an endothermally reacting substance, preferably an endothermally reacting substance selected from the group consisting of aluminum hydroxide, boehmite, gibbsite, goethite, magnesium hydroxide, huntite, brucite or mixtures thereof.

The present disclosure further relates to the use of the flameproofing agent according to examples of the disclosure as flame retardant for combustible materials, in particular combustible building materials, rubber, chipboard material, plastics, in particular cable sheathings, cable insulation compound or cable filling compounds.

Furthermore the present disclosure relates to a fireproofed material system, comprising a combustible material and a flameproofing agent according to examples of the disclosure.

The combustible material may in particular be a building material, a rubber product, a chipboard, a facade cladding or a plastic product, in particular a cable sheathing, cable insulation compound or a cable filling compound.

The fireproofed material system contains the flameproofing agent preferably in a proportion of 3 to 95% by weight, more preferably 5 to 90% by weight, more preferably 10 to 80% by weight, more preferably 20 to 75% by weight, more preferably 25 to 70% by weight, in particular 30 to 60% by weight.

In a modification the flameproofing agent used in the fireproofed material system preferably comprises the modified red mud according to the disclosure in a proportion of 30 to 100% by weight, more preferably 40 to 95% by weight, more preferably 50 to 90% by weight, more preferably 60 to 85% by weight, and the respective remaining proportion of 0 to 70% by weight, preferably 5 to 60% by weight, more preferably 10 to 50% by weight, more preferably 15 to 40% by weight, is formed by a further flame-retardant composition. In this case it is advantageous if the further flame-retardant composition comprises an organic, non-toxic, endothermally reacting substance such as APP, MC, MIC, etc. and/or a synergist. In this case it is likewise advantageous if the further flame-retardant composition comprises salt hydrates, hydroxides, oxide hydroxides and carbonates, oxycarbonates as well as hydroxycarbonates.

The present disclosure further relates to a method for producing a fireproofed material system comprising, in some examples, the steps of:
  a) providing a combustible material,
  b) coating or blending the combustible material with the flameproofing agent according to examples of the disclosure, and thereby
  c) obtaining the fireproofed material system.

In this case it is advantageous if before the coating or blending in step b) the flameproofing agent is physically treated, in particular ground or disagglomerated, preferably together with synergists, in particular organoclays (nanoclays), tin compounds and borates, and/or at least one further flame-retardant additive.

The flameproofing agent referred to in step b) is preferably subjected to a surface modification. This takes place preferably before the coating or blending with the combustible material.

The surface modification of the flameproofing agent preferably comprises providing the surface of the flameproofing agent with a surface modifying agent which is selected from the group consisting of organosilanes, organotitanates, organo-zirconium aluminates, carboxylic acid derivatives, softeners, oligomer and polymer precursors, ionomers, boric acid and the metal salts and derivatives thereof, zinc stannates, zinc hydroxystannates or combinations thereof.

It is likewise advantageous if, in particular when the flameproofing agent according to examples of the disclosure is used in elastomeric, thermoplastic and thermosetting systems, synergists in the form of so-called "master batches" (active substance concentrates) in liquid, paste or granulate form are added during the processing.

A method according to the disclosure for producing the modified, carbonised red mud (MKRS-HT) comprises, in some examples, the steps of:

a) providing red mud,
b) reducing the iron (III) compounds contained in the red mud in acidic solution to iron (II) compounds,
c) adding a carbonate compound to the solution containing iron (II) compounds obtained in step b), wherein iron (II) carbonate (siderite) is formed.

Preferred reducing agents which can be used in step b) are sulfur-containing reducing agents, in particular ($Na_2S_2O_4$) and sulfur dioxide ($SO_2$).

The reduction of the iron (III) compounds contained in the red mud to iron (II) compounds according to step b) preferably takes place in weak acidic solution, for example at a pH value of 4 to 6, in particular a pH value of 4.5 to 5.5.

Preferred carbonate compounds which can be used in step c) are alkali carbonates, alkali hydrogen carbonates and alkaline earth carbonates, in particular sodium carbonate ($Na_2CO_3$), sodium hydrogen carbonate ($NaHCO_3$) and calcium carbonate ($CaCO_3$). As is clear to the person skilled in the art on the basis of his specialist knowledge, the pH value of the solution containing acidic iron (II) compounds obtained in step b) must if appropriate be adjusted in a suitable manner before step c) in order to obtain iron (II) carbonate (siderite) by addition of a carbonate compound.

The present disclosure further relates to a method for producing the modified red mud comprising, in some examples, the steps of:
a) providing red mud (RM),
b) separately producing iron (II) carbonate from available starting substances;
c) mixing RM and iron (II) carbonate;
d) obtaining modified carbonised red mud (MKRS-hat).

In this way the iron (II) carbonate can be easily subjected to modifications by physical and/or chemical methods in order to achieve special application-specific characteristics.

The modified, carbonised and rehydrated red mud may be produced, in that modified, carbonised red mud (MKRS-HT), such as is for example described above, and modified, rehydrated red mud (MR2S-NT), such as is described for example in WO 2012/126487 A1, the disclosure of which is hereby incorporated in its entirety, are produced separately from one another and then mixed together to obtaining the modified, carbonised and rehydrated red mud.

However, by suitable conduct of the reaction it is also possible for both a rehydration and also a recarbonization to proceed in the red mud to obtain the modified, carbonised and rehydrated red mud. In order to guide the modification in a targeted manner in one or the other direction suitable technical measures can be adopted, such as for example conduct of the reaction under (oxidative) inert process gas, special drying followed directly by surface modification ("sealing") for a preferred modification in the direction of siderite. On the other hand, if predominantly goethite is to be produced, the reaction proceeds with atmospheric oxygen or alternatively ozone which oxidize the Fe (II) salt solutions to Fe (III) salt solutions. As the pH value rises goethite is produced which can likewise be dried and sealed at the surface.

Furthermore the surface modification/sealing serves to guarantee an optimal bonding of the polymer molecules in the interphase to the OHFR flame retardant. In this way the compound characteristics are controlled in a targeted manner.

By a targeted process management under inert gas or with atmospheric oxygen, drying and surface modification it is possible to produce a carbonised and rehydrated red mud tailored for the required use.

The so-called inert process gas/protective gas should be free from all oxidizing components, especially (atmospheric) oxygen. In particular a process gas is used which is composed of equal parts of nitrogen and argon (TIG welding quality is sufficient) and which is circulated.

Examples, experiments and further embodiments are described below, which should not however lead to limitation of the present disclosure. On the contrary they serve for clarification of the teaching according to the disclosure and the advantages thereof.

Production of Modified Red Mud

Examples

Example 1

4 g red mud with a $Fe_2O_3$ content of 40% (1.6 g $Fe_2O_3$=0.01 mol) were admixed in the beaker with 60 ml of concentrated hydrochloric acid (0.6 mol) and stirred for 24 hours at room temperature.

After this time period a residue of 3.2 g could be separated off, i.e. 0.8 g $Fe_2O_3$ had dissolved (50%). With relatively long stirring and higher temperatures further $Fe_2O_3$ can be dissolved.

The pH value of the filtrate solution was set to 4.5 with dilute NaOH (0.5 mol NaOH in 100 ml water). Then 0.05 mol $Na_2SO_3 \times 7$ $H_2O$ (1.3 g) in 50 ml $H_2O$ were added. After several hours the yellow solution was almost colorless. 1.2 g of precipitate was produced from this solution by addition of 0.8 g $Na_2CO_3$. According to PXRD this product consisted of 50% each of siderite and goethite. After a relatively long time period the precipitated product is initially colored greenish and then brown, i.e. the Fe (II) carbonate oxidised in the air to Fe (III) compounds. If on the other hand oxygen is excluded, siderite is predominantly precipitated which remains stable in the long term.

Thus it can be seen that under inert conditions siderite is precipitated, and under oxidative conditions goethite is precipitated at the end. Intermediate stages which contain siderite and goethite can be intercepted at any time and dried and can be sealed at the surface.

Example 2

The equipment used are preferably a correspondingly equipped spray tower (from NIRO Atomizer, Copenhagen). In this case the dried and optionally simultaneously surface-modified material is produced for example according to surface modification "A" (see below) on a microscale. If a nanoscale material is required for application-specific reasons, after the drying by means of a swirl fluidizer the surface coating can be carried out in the fluid mixer/fast mixer connected downstream.

Spray Tower:

The drying, the setting of the grain size distribution curve (Top-cut; d90, d50 and d10) and optionally the surface modification of the material preferably take place in the spray tower.

In the case illustrated here, i.e. with surface modification "A", the slurry which is to be introduced with a solids content, which can vary within wide limits, of for example 50%, has added to it the appropriate quantity of aminopropyl triethoxysilane (1% by weight AMEO from Evonik/Degussa based on the solids content; see section "surface modifications") with intensive stirring. The organosilane reacts by hydrolysis to an oligo-organosilanol, which is absorbed on the surface of the material to be dried and is fixed there, forming covalent bonds (see Edwin S. Plueddeman, Silane Technology, Elsevier, N.Y., USA).

Additionally 0.3% by weight (based on the solids content) of DISPEX A 80 is added to the slurry as dispersing and fluidifying agent, which makes the slurries pumpable in the first place.

The secondary particle size (i.e. the required degree of agglomeration) is set by the variation of the inlet temperature (typically between 500° C. and 300° C.) and the outlet temperature (typically between 120° C. and 60° C.) of the process gas, the spray disc rotation speed, the number and geometry of the nozzle orifices, the throughput per hour of slurry, within limits even above the slurry concentration (solids content).

If the spray tower is used without the aminosilane surface modification, MR2S-NT or MKRS-HT is produced on a microscale with optimized goethite or siderite content (depending upon the desired optimization according to the process management described above).

Optionally "disagglomeration" is carried out in a pinned disc mill (Fa. Alpine) connected downstream, i.e. the average particle size is set to a bandwidth of 1 until 1.5 µm (d50).

The grain size distribution curve corresponds approximately to that of a finely divided precipitated aluminum hydroxide, such as for example MARTINAL OL 104 (Martinswerk/Albemarle) or SUPERFINE SF4ESD (Alcan Ltd.), or that of a synthetic magnesium hydroxide, such as for example MAGNIFIN H5 (Magnesit Prod. Gesellschaft).

This particle size distribution curve enables a virtually optimal compounding into most thermoplastic and thermosetting polymer systems as well as rubber systems. The same applies to all thermoplastic elastomer (TPE) systems.

Swirl Fluidizer:

The drying and the adjustment of a nanoscale product preferably takes place in the swirl fluidizer.

The optional surface modification is carried out exclusively in the fluid mixer (fast mixer) connected downstream.

In this case a plurality of surface modifying agents of solid, liquid or pasty consistency can be used. An in situ polymerization on the surface of the OHFR system, such as MR2S-NT or MKRS-HT, is possible.

In the swirl fluidizer under the same process gas conditions as in the spray tower the material according to the disclosure is transported by means of a frequency-controlled monoscrew into the reaction chamber. The correspondingly configured tool splits the material to be dried in the process gas, nanoscale primary particles being predominantly produced.

The process is controlled in a targeted manner, so that the product is produced on a nanoscale, by the throughput per hour, the inlet and outlet temperature of the process gas, and the residual moisture content of the material according to examples of the disclosure selected as control variable as well as the configuration and the speed of rotation of the tool.

If a surface modification is to be carried out, the dry material (residual moisture content usually 0.05%) is metered into the fluid mixer connected downstream by means of a rotary valve and is coated there according to the description of "surface modification A, B, C and D".

In this case the outlet temperature of the optimized MR2S-NT or MKRS-HT, (typically 80° C.), which cools in the fluid mixer to approximately 50° C. equilibrium, is used to configure the surface modification process more effectively, since the material mixture quickly heats up to the respective reaction temperature.

The cooling mixer cools the product to room temperature, so that the product can be bagged immediately without intermediate silo storage.

DTA and TG Analyses

FIG. 1 shows DTA and TG curves of red mud (comparative example). Between 220° C. and 350° C. endothermic reactions can be seen, which are attributable to residues of gibbsite/boehmite and goethite. In the red mud the decomposition intervals of hydroxides/oxide hydroxides of aluminum and of iron are shifted into somewhat higher temperature ranges.

Figure 2:
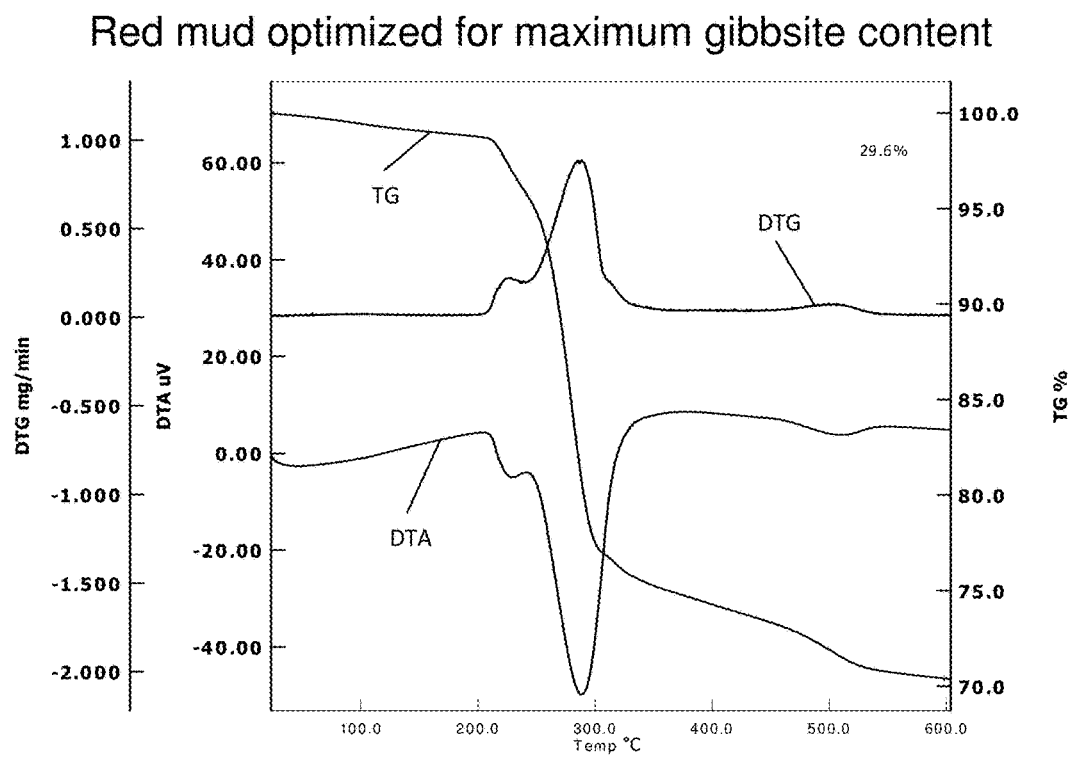
FIG. 2 shows differential thermoanalysis and thermogravimetry curves of an example red mud which has been rehydrated in the direction of gibbsite.

FIG. 2 shows DTA and TG curves of red mud which has been rehydrated in the direction of gibbsite (reference example). In this case goethite is also additionally produced. The endothermic reaction takes place between 210° C. and 350° C.

Figure 3:
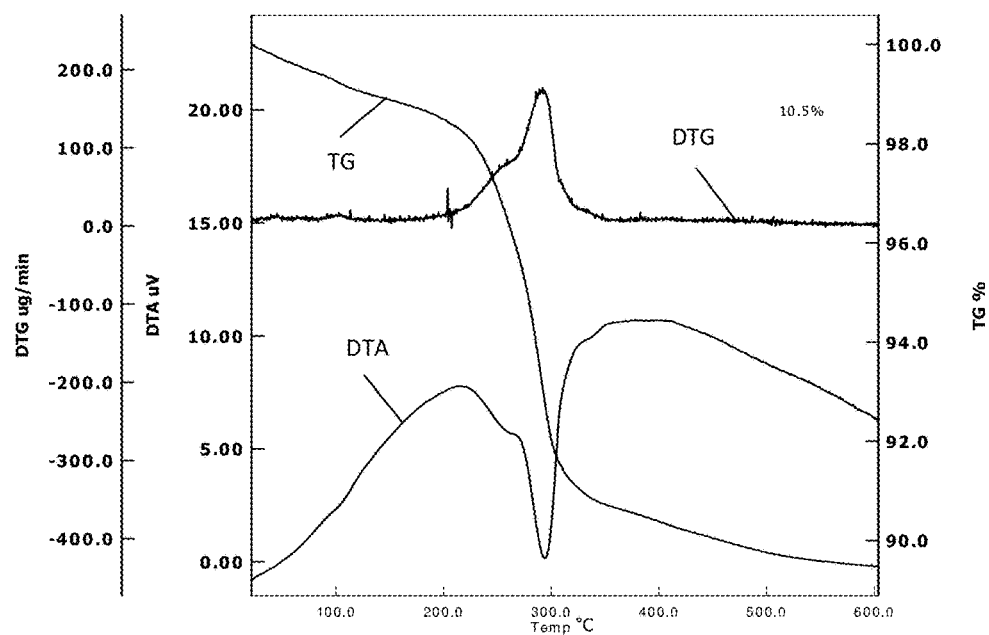
FIG. 3 shows differential thermoanalysis and thermogravimetry curves of an example red mud which has been rehydrated in the direction of goethite.

FIG. 3 shows DTA and TG curves of red mud which has been rehydrated in the direction of goethite (reference example). In this case gibbsite is also additionally produced. The endothermic reaction takes place between 210° C. and 350° C.

Figure 4:
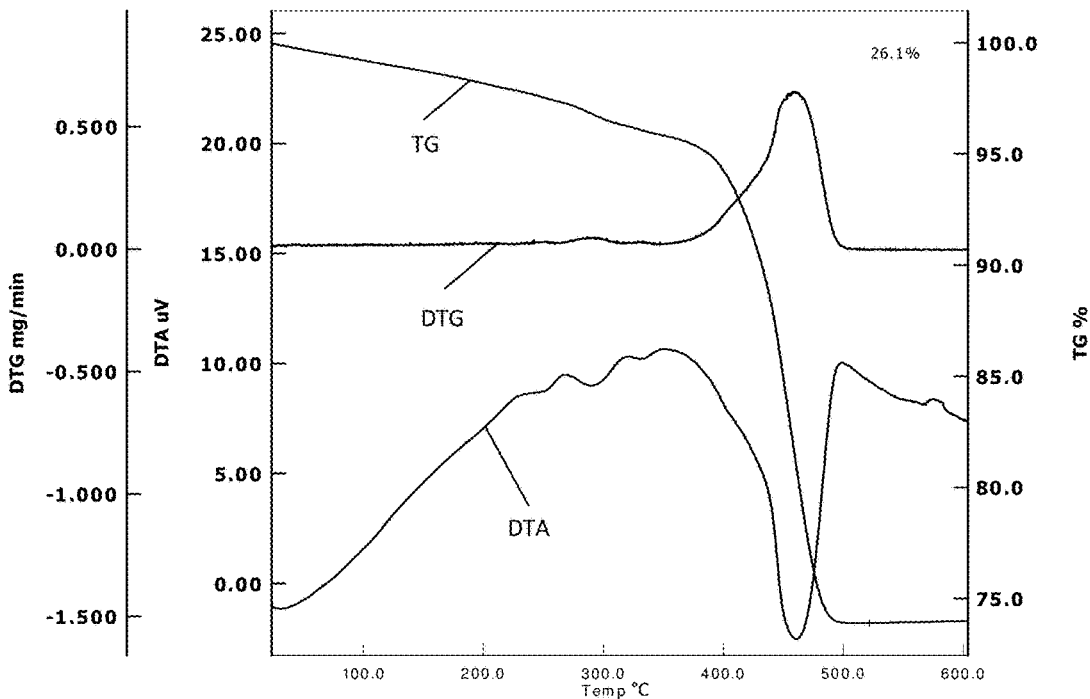
FIG. 4 shows differential thermoanalysis and thermogravimetry curves of an example red mud which has been recarbonized in the direction of siderite to provide a modified, recarbonized red mud (MKRS-HT)).

FIG. 4 shows DTA and TG curves of red mud which has been recarbonized in the direction of siderite (example according to the invention: modified, carbonised red mud (MKRS-HT)). The endothermic reaction takes place between 350° C. and 500° C., that is to say in the high-temperature range.

Figure 5:
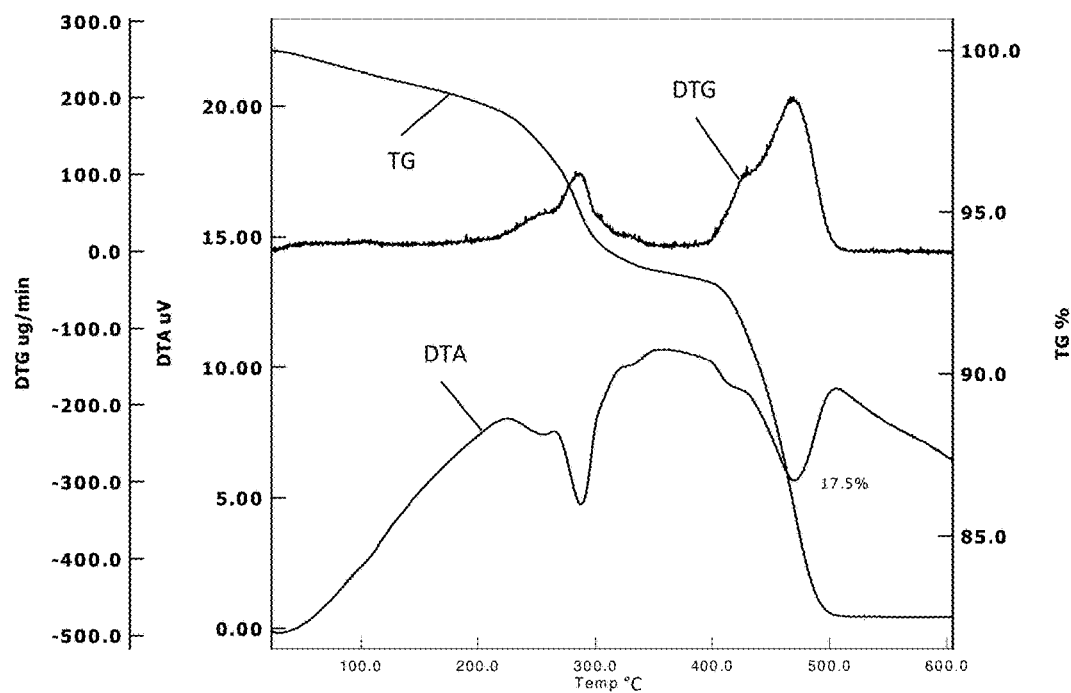
FIG. 5 shows differential thermoanalysis and thermogravimetry curves of an example red mud which has been rehydrated in the direction of goethite and also recarbonized in the direction of siderite to provide a modified, recarbonized and rehydrated red mud (MKRS-HT/MR2S-NT)).

FIG. 5 shows DTA and TG curves of red mud which has been rehydrated in the direction of goethite and also recarbonized in the direction of siderite (example according to the disclosure: modified, carbonised and rehydrated red mud (MKRS-HT/MR2S-NT)). The endothermic reaction for the hydroxides/oxide hydroxides goethite/gibbsite takes place between 220° C. and 350° C. in the low-temperature range (LT) and for siderite between approximately 350° C.-500° C. in the high-temperature range (HT). Thus products of this type show endothermic reactions from approximately 220° C. to 500° C.

Figure 6:
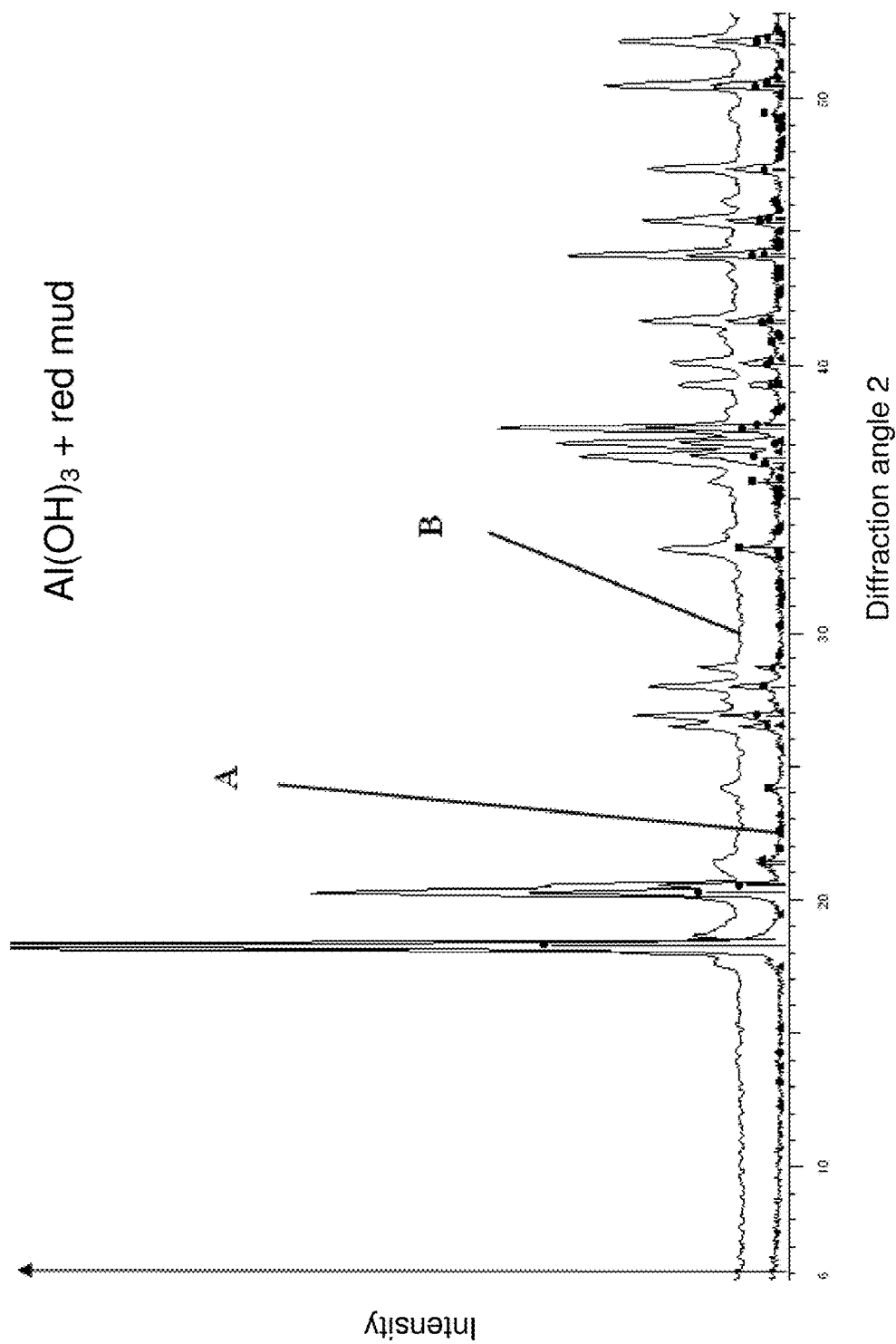
FIG. 6 shows a radiographic diagram of an example red mud which has been rehydrated in the direction of gibbsite.

Radiographic Analyses:

FIG. 6 (diagram 1) shows the radiographic diagram of red mud which has been rehydrated in the direction of gibbsite (cf. DTA and TG curves FIG. 2). The line diagrams show:

Line Diagram A:

Type: 2Th/Th locked-Start: 5.000°-end: 70.000°-Step: 0.040°-Step time: ° C. (Room)-Time Started: 15 s 2-Theta: 5.000°-Theta: 2.500°-Chi: 0.00° mm operations: Import Line Diagram B:

Type: 2Th/Th locked-Start: 5.000°-end: 70.000°-Step: 0.040°-S (Room)-Time

Started: 15 s 2-Theta: 5.000°-Theta: 2.500°-Chi Operations: Y Scale Add 1251 Background 0.000,1.0001 Y Scale M Import Legend:

■ 00 033 0664 (*)-Hematite, syn-$Fe_2O_3$— Y: 1.36%-d x by: 1.-WL: 1.5406-Rhombo.H.axes-a 5.03560-b 5.03560-c 13 120.000-primitive-R-3c (167)-6-301.926-1/k PDF ● 01-070-2038 (C)-gibbsite-$Al(OH)_3$— Y: 7.80%-d x by: 1.-WL: 1.5406-Monoclinic-a 8.68400-b 5.07800-c 9.73600-a Primitive-P21/n (14)-8-427.985-1/1c PDF 1.8-F30=6

Figure 7:
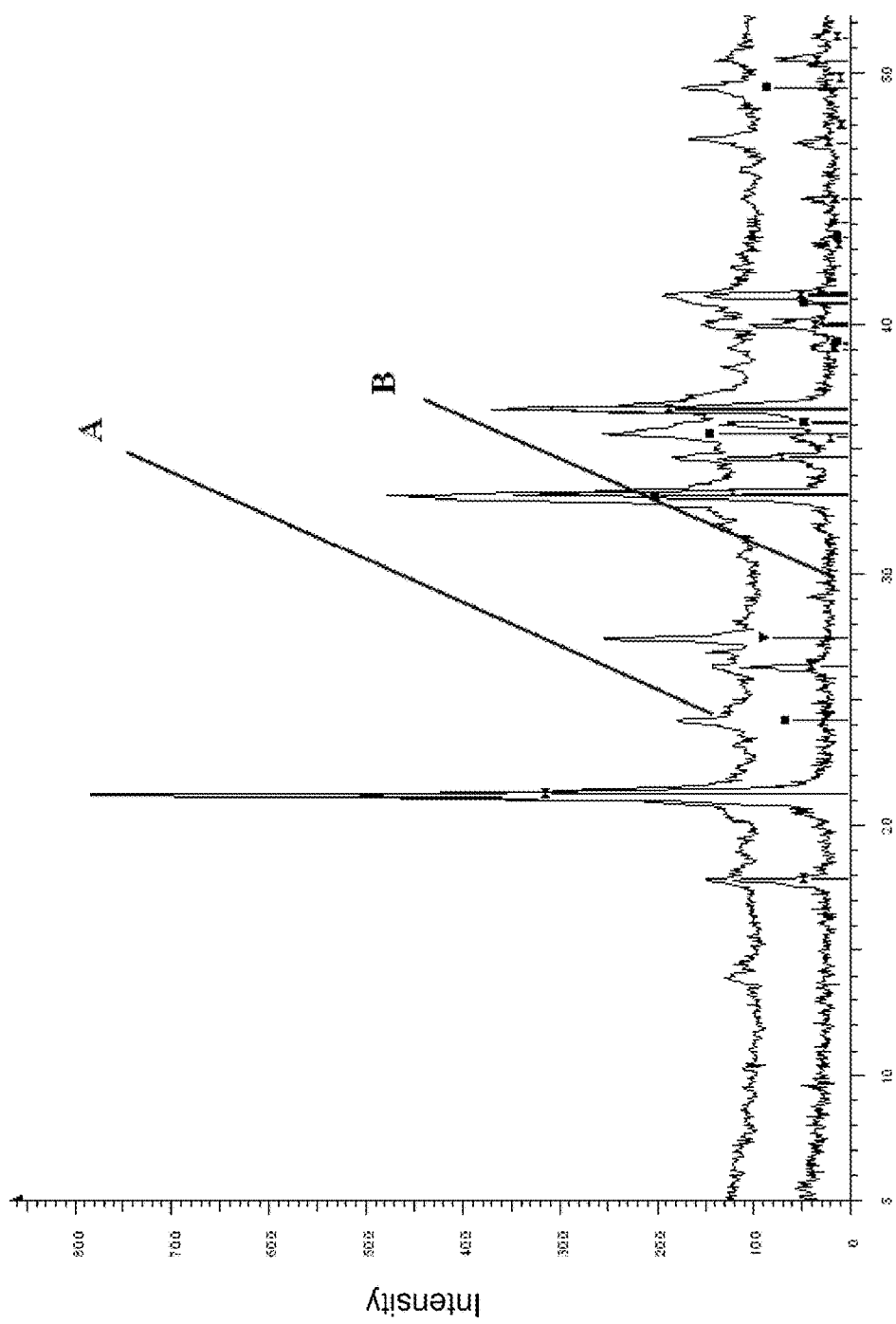
FIG. 7 shows a radiographic diagram of an example red mud which has been rehydrated in the direction of goethite.

▲ 00-049-0007 (*)-sodium aluminum silicate-Na1.15A11.15Si0.8504-Y: 0.65%-d x by: 1.-WL: 1.5406-Orthorhombic-a 90.000-beta 90.000-gamma 90.000-primitive-Pc21b FIG. 7 (diagram 2) shows the radiographic diagram of red mud which has been rehydrated in the direction of goethite (cf. DTA and TG curves FIG. 3). The line diagrams show:

Line Diagram A:
  Type: PSD fast scan-Start: 5.000°-end:
  time: 1. s-Temp.: 25° C. (Room)-Time
  Theta: 1.544°-Phi: 0.00°-Aux1: 0 0A
  Add 83-Range Op. A+B Import
Line Diagram B:
  Type: 2Th/Th locked-Start: 5.000°-end:
  time: 10. s-Temp.: 25° C. (Room)-Time
  Theta: 2.500°-Chi: 0.00°-Phi: 0.00°-Phi:
Legend:
  ■ 00-033-0664 (*)-Hematite, syn-$Fe_2O_3$— Y: 21.62%-d x by: 1.-WL: 1.5406-Rhombo.H.axes-a 5.03560 b 5.03 90.000-gamma 120.000-primitive-R-3c (167)-6-301.9
  ▼ 00-021-1276 (*)-rutile, syn-$TiO_2$— Y: 8.94%-d x by: 1.-WL: 1.5406-Tetragonal-a 4.59330 b 4.59330-c 2.95 90.000-primitive-P42/mnm (136)-2-62.4344-1/Ic
  ▶◀ t 01-081-0463 (C)-goethite, syn-FeO(OH)-Y: 34.21%-d x by: 1.-WL: 1.5406-Orthorhombic-a 4.61580-b 9.95
  90.000-gamma 90.000-primitive-Pbnm (62)-4-138.915

Figure 8:
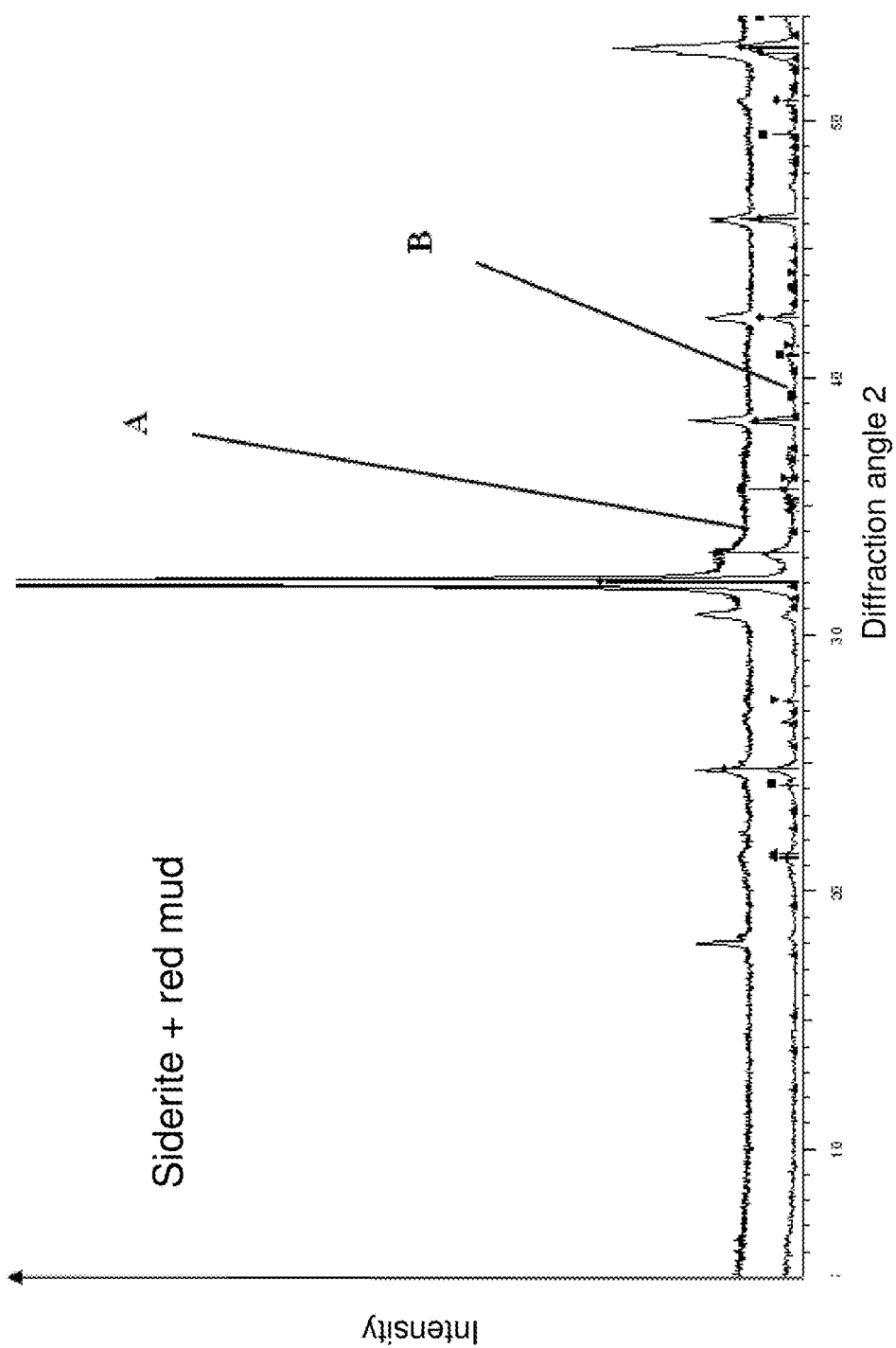
FIG. 8 shows a radiographic diagram of an example red mud which has been recarbonized in the direction of siderite.

FIG. 8 (diagram 3) shows the radiographic diagram of red mud which has been recarbonized in the direction of siderite (cf. DTA and TG curves FIG. 4). The line diagrams show:
Line Diagram A:
  Type: 2Th/Th locked-Start: 5.000°-End: 7
  Temp.: 25° C. (Room)-Time Started: 15. s
  °-Phi: 0.00°-X: 0 Operations: Y Scale Add
Line Diagram B:
  Type: 2Th/Th locked-Start: 5.000°
  time: 10. s-Temp.: 25° C. (Room)
  °-Theta: 2.500°-Chi: 0.00°-Phi:
Import
Legend:
  ■ 00-033-0664 (*)-Hematite, syn $Fe_2O_3$— Y: 1.83% d x by: 1.-WL: 1.5406-Rhombo.H.axes-a 5.03560-b 5.03
  90.000-gamma 120.000-Primitive-R-3c (167)-6-301 0.926-I/Ic PDF
  ♦ 01-083-1764 (C)-siderite-$Fe(CO_3)$ Y: 439% d x by: 1.-WL: 1.5406 Rhombo.H.axes-a 4.691 60-b 4.69160 90.000-gamma 120.000-primitive-R-3c (167)-6-293.169-I/Ic PDF 3.6
  ▲ 00-049-0007 (*)-sodium aluminum silicate-Na1.15Al1.15Si0.8504-Y: 0.53%-d x by: 1.-WL: 1.5406-Orthorhomb
  10.21400-alpha 90.000-beta 90.000-gamma 90.000-Primitive-Pc2lb (
  ▼00-021-1276 (*)-rutile, syn-$TiO_2$ Y: 0.49%-d x by: 1. WL: 1.5406-Tetragonal-a 4.59330-b 4.59330-c 2.
  gamma 90.000-primitive-P42/mnm (136)-2-62.4344-I/Ic PDF 3.4-F3

Figure 9:
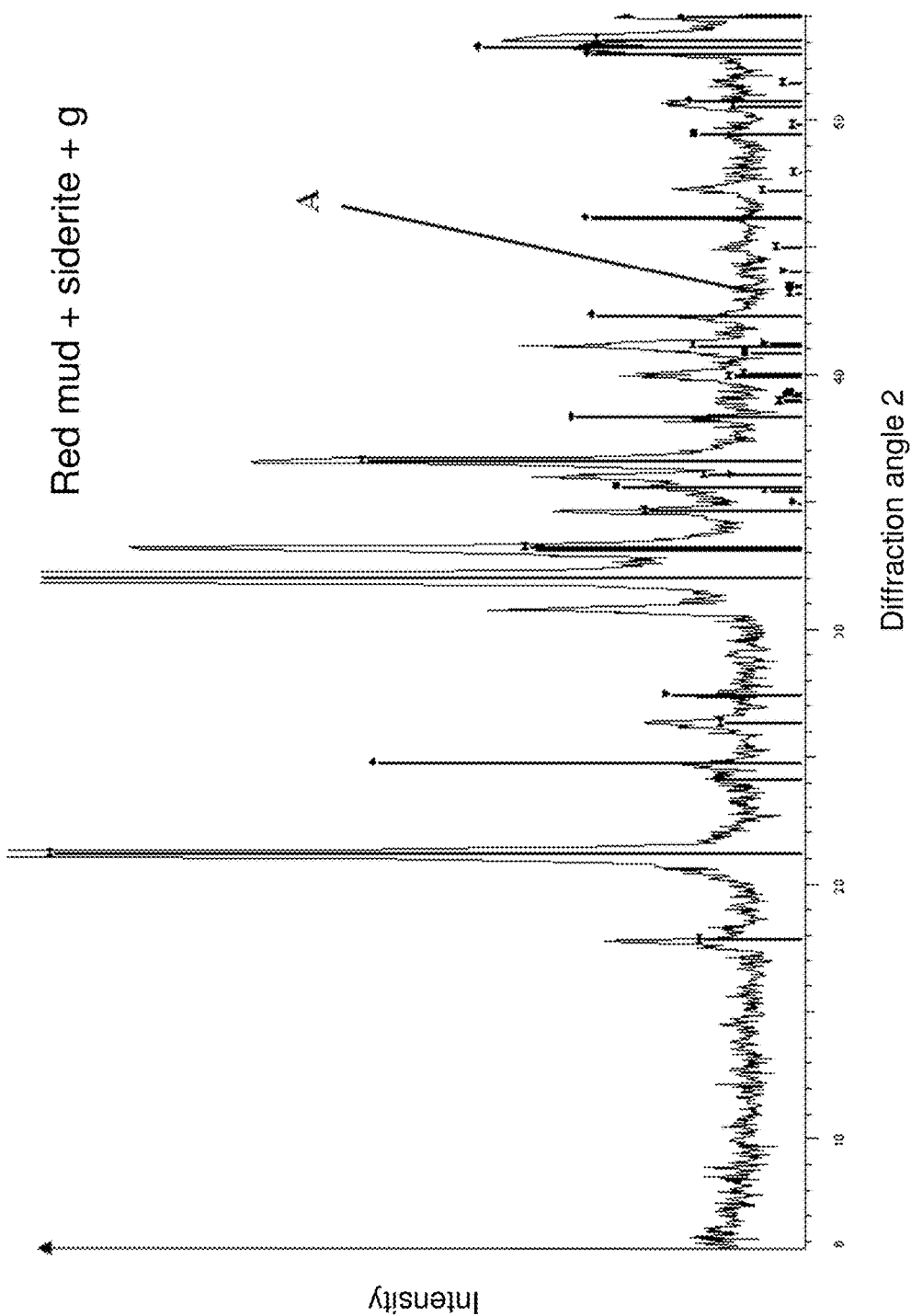
FIG. 9 shows a radiographic diagram of an example red mud which has been both recarbonized in the direction of siderite and rehydrated in the direction of goethite.

FIG. 9 (diagram 4) shows the radiographic diagram of red mud which has been both recarbonized in the direction of siderite and rehydrated in the direction of goethite (cf. DTA and TG curves FIG. 5). The line diagram shows:
Line Diagram A:
  33% red mud+33% siderite+33%
  End: 70.000°-Step: 0.040°-Step ti
  14 s-2-Theta: 5.000°-Theta Opera
Legend:
  ■ 00-033-0664 (*)-Hematite, syn-$Fe_2O_3$— Y: 1.36%,-d x by: 1.-WL: 1.5406-Rhombo.H.axes-a 5.03560-b 5.03560-.c
  gamma 120.000-primitive R 3c (167)-6-301.926-1/Ic PDF
  ▲ 01-083-1764 (C) siderite $Fe(CO_3)$ Y: 6.22% d x by: 1.-WL: 1.5406-Rhombo.H.axes-a 4.691 60-b 4.69160-c 15
  gamma 120.000-primitive-R-3c (167)-6-293.169-I/Ic PDF 3.6
  ▼ 00-021-1276 (*)-rutile, syn-$TiO_2$— Y: 0.69%-d x by: 1.-WL: 1.5406-Tetragonal-a 4.59330-b 4.59330-c 2.95920 90.000-primitive-P42/mnm (136)-2-62.4344-1/1c PDF 3.4-S
  ▶◀ 1101-081-0463 (C)-goethite, syn-FeO(OH)-Y: 3.95% d x by: 1.-WL: 1.5406-Orthorhombic-a 4.61580-b 9.95450
  gamma 90.000-primitive-Pbnm (62)-4-138.91 5-I/Ic PDF 2.

DISCUSSION

The standard method for qualitative and quantitative determination of the phase composition of samples in powder form is X-ray powder diffractometry. It is a versatile, non-destructive method which can also supply detailed information about the atomic structure and the crystal structure both from naturally occurring and also synthetically produced materials. In this case each crystalline material when illuminated with X-ray radiation exhibits a unique and characteristic diffraction pattern which is defined by size, symmetry and atomic structure and can be used for unambiguous identification.

The expression "thermal analysis" covers methods which measure chemical and/or physical characteristics of a compound as a function of the temperature. In this case the change in mass of a sample is measured in the thermogravimetry (TG) as a function of the temperature and/or of the time. A thermobalance integrated into the measuring instrument serves for this purpose. On the other hand the differential thermoanalysis (DTA) uses the characteristic thermal energy turnover at a phase transition for quantitative and qualitative analysis. In this case the temperature of the sample is compared with that of a reference substance.

The radiographic diagram and the DTA and TG curves demonstrate that red mud can be both rehydrated and also recarbonized. In all cases red mud has been used which is produced at the tube digester (270° C./60 bar).

In the recarbonization siderite is predominantly produced, and in the rehydration predominantly gibbsite/boehmite and especially goethite is produced.

In the production of these products red mud was reduced in the first step in an acidic solution. In the second step siderite was precipitated out of this solution undergoing oxidatively inert conditions by the addition of $NaHCO_3$, $Na_2CO_3$ or $CaCO_3$. If optimization in the direction of gibbsite or goethite is required, goethite and gibbsite are precipitated by increase of the pH value under oxidizing conditions.

Thus overall and according to the disclosure, OHFR systems which exhibit their endothermic flame-retardant effect in the range from 210° C. to 310° C., or 350° C. to 500° C. can be produced from red mud by rehydration or recarbonization.

Thus by arrangement of the recarbonization and rehydration one after the other or by mixing of carbonised and rehydrated red mud, tailored OHFR products for all types of plastic systems are produced both in the low-temperature range and also in the high-temperature range.

From the figures it can be seen how modified rehydrated or modified carbonised red mud, which has been modified predominantly either in the direction of gibbsite/boehmite and goethite/lepidocrocite/akaganeite or predominantly in the direction of siderite, is thermally decomposed and the temperature ranges in which this occurs.

In this case the respective oxides and water are produced from the hydroxides or the oxide hydroxides of aluminum and of iron, and the corresponding oxide and $CO_2$ is produced from iron (II) carbonate. The $CO_2$ produced acts additionally as a fire-extinguishing agent.

In particular siderite decomposes in a temperature range in which the hydroxides and oxide hydroxides have already decomposed and thus can no longer make an effective contribution to the flameproofing.

The significantly higher decomposition temperature of siderite is advantageous in so far as, under testing according to UL 94 vertical, after the complete dehydration of the hydroxides and oxide hydroxides the burning process can occur again. Thus with MKRS-HT optimized for a high siderite content, a suitable OHFR flame retardant is available for higher temperature ranges.

Overall the possibility is offered of developing a FR system in which by skillful combination of low-temperature OHFR agents, such as ATH or goethite, lepidocrocite, akaganeite, and high-temperature OHFR agents, such as preferably iron (II) carbonate, the necessary flameproofing, or respectively the spread of fire which is inherent in the system can be controlled so that the optimal OHFR effect is achieved for each polymer system or respectively FR compound system.

Thus according to examples of the disclosure "tailored" OHFR materials can be synthesised in a targeted and highly specific manner with modified rehydrated red mud (MR2S-NT) and/or carbonised red mud (MKRS-HT). It is also possible to produce such products for flameproofing by mixing red muds modified in the direction of MR2S-NT or in the direction of MKRS-HT.

The effect can also be intensified by the described surface modification and combination with the described synergists, in particular nanoclays.

In principle it may be established that the processing temperature of the material systems to be flameproofed determines which products the modified red mud should contain. In the field of high-temperature flame protection, products for low-temperature flame protection such as ATH, goethite, lepidocrocite and akaganeite are unsuitable, since such these products already decompose during processing. Red muds which are rehydrated and/or recarbonized in a specific and targeted manner according to examples of the disclosure and which satisfy the required conditions can be produced by a correspondingly controlling of the rehydration process or recarbonization process. Conversely in low-temperature flame protection the products of high-temperature flame protection are not disruptive in principle, since the decomposition temperature of these materials is far higher than the polymer processing temperature. In contrast it is advantageous, since the decomposition of the siderite-optimized MKRS-HT substantially increases the flameproofing potential.

Surface Modification:

Surface modifications have a substantial influence on the quality of the FR systems and on the workability thereof during the compounding. Furthermore selected surface modifications support the FR effect and the bonding in the interphase (compatibilization effect).

The following recipes are used for example for a surface modification:

1) Surface Modification A:

1% by weight of n-aminopropyl triethoxysilane (AMEO) from Degussa/Evonik, based on the total mass of the non-polymer components 2) Surface Modification B:

1% by weight EDENOR C 12/98-100 (Henkel, Germany), 1.5% by weight SFR 100 (General Electric Silicones, Schenectady, N.Y., USA), based on the total mass of the non-polymer components 3) Surface Modification C:

| | |
|---|---|
| 2% by weight | Trilene 66 (Uniroyal) (liquid EP(D)M polymer), |
| 1% by weight | Unichema 4900 (Stearic acid) Unichema, |
| 1% by weight | Levapren 600 (EVA-copolymer), | based on the total mass of the non-polymer components

4) Surface Modification D:

| | |
|---|---|
| 1% by weight | Lithsolvent PL (Fa. Keller & Bohacek, Düsseldorf, Germany), |
| 2% by weight | Epikote Resin 1163, |
| 1% by weight | EDENOR C 14 (Henkel), | based on the total mass of the non-polymer components

A fluid mixer or also a turbine mixer which has a multi-level variable tool and of which the outer casing can be temperature-controlled is used for the surface modification.

The reaction additives are metered into the mixing/reaction chamber either at the start of the mixing cycle with the material to be modified in the stationary or in the slowly starting turbomixer. If the modification additives are intended to be liquid to pasty, they are metered into the funnel of the mixer.

After the ending of the reaction the hot material is cooled gently to room temperature or bagging temperature (typically 35° C. to 23° C.) in the cooling mixer connected downstream. This material is characterized by powder technology and is then used in polymer compounds described below.

The OHFR materials according to examples of the disclosure which are described are durable for any period of time and in the described modifications have no chemically discernible expiry date, presupposing appropriate dry storage in preferably closed original packaging. Due to the particle size distribution, the permanent risk of partial or total separation, due for example to transport processes or at the discharge from the silo or the weigher on the compounding unit, does not exist as in the case of the FR compositions blended from individual components with different average particle size values (d50). The previously described OHFR materials according to examples of the disclosure can be used in the respective compounding as they are, i.e. for example without predrying. Specially the surface-modified variants of the OHFR materials according to examples of the disclosure take no moisture out of the ambient air and thus can be used unchanged/without predrying.

Method for Processing the Materials According to Examples of the Disclosure to Produce the OHFR Compounds Referred to in the Example:

Test Materials Used:

Polymers

EVA copolymer "ESCORENE ULTRA UL 00119" from ExxonMobil

PP random copolymer "VESTOLENE PP 8400"

polyamide 6 "ULTRAMID B3L" from BASF

PVC DS 7060 from ICI UK

Flame Retardant aluminum hydroxide "SUPERFINE SF4 ESD" from Alcan Chemicals Ltd. Burntisland, Scotland, UK (zero sample)

magnesium hydroxide "Magnifin H 5" from Veitscher Magnesit
Produktionsgesellschaft, Breitenau, Austria (zero sample)
pentabromodiphenylether p.a. and antimony trioxide p.a. (zero sample)
MR2S-NT (zero samples)
MKRS-HT (sample according to the disclosure)
MR2S-NT/MKRS-HT (sample according to the disclosure)

Additives/Synergists
  Nanoclay: "Bentone 104" from Elementis Inc., USA or "Nanofil SE 3000" from Südchemie/Rockwood Clay Additives GmbH, Germany
  zinc stannate "FLAMTARD S" from Joseph Storey, UK Compounding Units All quoted polymer compounds were, as indicated in the respective tables, processed on the following compounding units to produce the corresponding molding compounds:
1) BUSS coaxial kneader (MDK 46 E, 15 L/D with GS 70 3.5 D) with an average throughput of 15 to 20 kg/h
2) co-rotating twin-shaft(-screw) extruder (DSE or SSE) Werner & Pfleiderer ZSK 25 with an average throughput capacity from 12 to 25 kg/h or Leistritz GL 50 mm with 44 L/D with an average throughput capacity from 60 to 250 kg/h.

Metering Equipment

Gravimetric weighers (loss-in-weight feeder) on all feed stations for polymers, additives/stabilizers and OHFR agents both in the main intake (ELS 1 in the BUSS co-kneader) and also "downstream" wherein the polymer granulate weigher functions as master weigher.

In the split-feed mode the OHFR agents are in each case metered into the polymer stream distributed over the three metering stations.

The compounds present in the form of granulate are then processed both by means of injection molding and also by means of extrusion to produce the corresponding test objects according to DIN/ISO and ASTM and are then tested. The test objects for testing of the specific contact resistance are produced from a rolled sheet blank by melting of the granulate on a temperature-controlled laboratory double roller in a heated/coolable panel press. Before the respective tests the finished test objects are equilibrated in the standard room climate.

Tests

| | |
|---|---|
| Tensile strength [MPa] DIN EN ISO 527 | (referred to here as TS) |
| Tensile modulus of elasticity [MPa] DIN EN ISO 527 | (referred to here as E-Mod) |
| Elongation at break [m/m] DIN EN ISO 527 | (referred to here as EL) |
| Tear resistance [MPa] DIN EN ISO 527 | (referred to here as TR) |
| Impact strength [kg/m$^2$] DIN EN ISO 8256 | (referred to here as a(n)) |
| Oxygen index [%] DIN EN ISO 4589-2 | (referred to here as LOI) |
| Charpy impact strength [kg/m$^2$] DIN EN ISO 179 | (referred to here as a(k)) |
| UL 94 Vertical according to IEC/DIN 60695-10/-11/-20 and CSA C 22.2 | |
| Cone calorimeter according to ISO 5660-1/ASTM E 1354 | |
| Specific contact resistance DIN ISO 53482 [Ω × cm] | (referred to here as SCR) |
| MFI (Melt Flow Index) at X° (C.) and Load weight y (kg) | in (g/10 minutes) |

Here in the case of EVA/PE normally 190° C. at 5 kg or at 10 kg for poorly flowing polymers. In the case of PP normally at 230° C. and 2.16 kg or 5 kg loading for the poorly flowing extrusion types In Table 4 the minimum requirements which are for example usual in Europe for cable compounds/cable sheaths.

TABLE 4

| | |
|---|---|
| Rating of the conductor temperature | 90° C. |
| Tensile strength | >10 MPa |
| Elongation at break | >1.5 m/m (=150%) |
| Water consumption | max. 5% (24 h at 100° C.) |

Generally all variants of the OHFR material according to the disclosure can be produced on all processing machines/compounding units which are used in the (plastics) industry for the production of (highly) filled polymer compounds, such as for example (Banbury) internal mixer; double roll mills; internal mixer; Farrel continuous mixer (FCM); planet shaft extruder; SSE (single screw extruder) with screws which enable an effective homogenization (Maddox mixer head, locking rings); intensive mixer.

As a result of the high bulk density (UTBD) both the low-temperature variant and also the high-temperature variant of the modified RM and the extremely good pourability the materials can be added into the compounding machine extremely well both with conventional volumetric metering equipment and also (preferably) with gravimetric metering equipment (so-called "loss-in-weight feeder" for example from K-Tron-Soder or Brabender).

Examples

Examples for EVA

0) Basic Formulation as Zero Sample
Formulation:

| | |
|---|---|
| EVA 00119 | 40% |
| ATH | 60% |

Results:

| | |
|---|---|
| TS: | 8.9 |
| TR: | 6.5 |
| EL: | 0.29 |
| SCR: | E13 |
| MFI (190/10): | 1.6 |
| UL 94 V (3.2 mm): | V-0 |
| LOI: | 28 |

Comment:
  This formulation corresponds to the accepted standard within the cable industry and is the basis for comparison for the examples in the polymer system PE/EVA.

1)
Formulation:

| | |
|---|---|
| EVA | 40% |
| MKRS-HT | 60% |

Results:

| | |
|---|---|
| TS: | 9.8 |
| EL: | 1.6 |
| SCR: | E 14/E 12 |

-continued

| UL 94 V (3.2 mm): | (V-2)* |
|---|---|
| LOI: | 26 |
| MFI (190/10): | 1.4 |

*the afterglow is too long, consequently the classification according to UL 94 vertical: n.m. (not met)

Comment:

In this formulation the modified recarbonized RM (MKRS-HT) is used exclusively. The mechanical values correspond to the standard. The afterglow can be suppressed by the addition of corresponding synergists—such as for example zinc stannate, borates, etc.

2) Formulation:

| EVA | 40% |
|---|---|
| MKRS - HT | 60%; surface-modified with coating "D" |

Results:

| TS: | 14.4 |
|---|---|
| EL: | 1.5 |
| SCR | E 15/E 14 |
| UL 94 V (3.2 mm): | V-1 |
| LOI: | 29 |
| MFI (190/10): | 2.3 |

Comment:

In this formulation modified carbonised RM (MKRS-HT) with the surface modification according to formulation "D" is used exclusively. The mechanical values are very good by comparison with the standard, the electrical values are likewise very good, the workability is significantly improved (by a factor of 2). The flameproofing is likewise improved. The compound can be used for very many W & C applications.

3) Formulation:

| EVA | 35% |
|---|---|
| MR2S-NT | 30% |
| MKRS-HT | 30% |
| Nanoclay | 5% |

The mixture of MRRS and nanoclay is provided with the surface modification "A".

Results:

| TS: | 16.6 |
|---|---|
| EL: | 3.41 |
| E-Mod: | 189 |
| SCR: | EI5/EI5 |
| UL 94 V (3.2 mm): | V-0 |
| LOI: | 28 |

Comment:

In this formulation a targeted mixture of modified rehydrated RM (MR2S-NT) and modified carbonised RM (MKRS-HT), that is to say a modified, carbonised and rehydrated red mud, with the surface modification "A" is used. The mechanical and electrical values are very good. An outstanding value for the specific contact resistance is shown. The flame resistance corresponds to that of a comparable ATH flameproof compound.

4) Formulation:

| EVA | 40% |
|---|---|
| MKRS-HT | 26% |
| MDH | 26% |
| Nanoclay | 5% |
| Flamtard S | 3% |

All non-polymer components are provided with the surface modification "C".

Results:

| TS: | 15 |
|---|---|
| EL: | 1.75 |
| SCR: | E 15/E 14 |
| UL 94 V (1.6 mm): | V-0 |
| LOI: | 49 |

Comment:

In this formulation modified carbonised RM (MKRS-HT) is used in a targeted combination with a conventional OHFR filler (here: MDH) in combination with synergists (nanoclay, zinc stannate). The mechanical, electrical and FR characteristics are outstanding by comparison with the aforementioned standard.

5) Formulation:

| EVA | 55% |
|---|---|
| MKRS-HT nanoscale | 18.5% |
| MDH | 18.5% |
| Nanoclay | 5% |
| Flamtard S | 3% |

The non-polymer components are provided with the surface modification "B".

Results:

| TS: | 19.6 |
|---|---|
| EL: | 2.9 |
| SCR: | E 15/E 15 |
| UL 94 V (1.6 mm): | V-0 |
| LOI: | 41 |

Comment:

In this formulation, by comparison with formulation 4), a reduced amount of flame retardant (combination of MKRS-HT on a nanoscale with MDH and synergists (nanoclay and Flamtard S)) with the surface modification according to formulation "B" is used. Nevertheless results are achieved which are comparable with those of formulation 4).

Examples for PVC:

0) Basic formulation as zero sample

Formulation:

| PVC DS 7060 | 24.7% |
|---|---|
| Plasticiser DIOP | 12.3% |
| ATH Superfine SF4 ESD | 61.7% |
| Irgastab EZ 712 | 1.3% |

Results:

|  |  |
|---|---|
| Time to Ignite (sec) | 34 |
| PHRR (KW/m$^2$) | 118 |
| THR (MJ/m$^2$) | 50.8 |
| Specific Extinct. Area (m$^2$/kg) | 116.5 |
| Fire Performance Index (m$^2$ s/KW) | 0.3 |
| Smoke parameter (MW/kg) | 18.7 |

Comment:

This formulation is the reference standard for PVC formulations.

1)
Formulation:

|  |  |
|---|---|
| PVC DS 7060 | 24.7% |
| Plasticiser DIOP | 12.3% |
| MKRS-HT | 61.7% |
| Irgastab EZ 712 | 1.3% |

Results:

|  |  |
|---|---|
| Time to Ignite (sec) | 69 |
| PHRR (KW/m$^2$) | 106 |
| THR (MJ/m$^2$) | 23.1 |
| Specific Extinct. Area (m$^2$/kg) | 122.0 |
| Fire Performance Index (m$^2$ s/KW) | 0.7 |
| Smoke parameter (MW/kg) | 14 |

Comment:

In this formulation modified carbonised RM (MKRS-HT) is used. The flameproofing values are improved by comparison with the ATH based standard.

Examples for PP

0) Basic Formulation as Zero Sample
Formulation:

|  |  |
|---|---|
| PP 8400 | 35% |
| MDH | 65% |

Results:

|  |  |
|---|---|
| TS: | 24.3 |
| TR: | 10.8 |
| EL: | 0.021 |
| E-Mod: | [3400]: |
| a(n): | 5.8 |
| UL 94 V (3.2 mm): | V-0 |
| MFI (230/5): | 4.6 |

Comment:

This formulation is the reference standard based on MDH which is accepted in the plastics industry.

1)
Formulation:

|  |  |
|---|---|
| PP 8400 | 35% |
| MKRS-HT | 65% |

Results:

|  |  |
|---|---|
| TS: | 17.5 |
| EL: | 0.23 |
| UL 94 V (3.2 mm): | V-2 |
| MFI (230/5): | 1.5 |

Comment:

In this formulation modified carbonised RM (MKRS-HT) is used exclusively. The elongation at break is improved by comparison with the zero sample, but the flameproofing does not reach the level of the values specified there.

2)
Formulation:

|  |  |
|---|---|
| PP 8400 | 35% |
| MKRS-HT | 60% |
| Nano | 5% |

The non-polymer components are provided with the surface modification "D".

Results:

|  |  |
|---|---|
| TS: | 19.1 |
| EL: | 0.56 |
| a(n): | o.Br(67) |
| UL 94 V (3.2 mm): | V-0 |
| MFI (230/5): | 6.1 |

Comment:

In this formulation, in addition to modified carbonised red mud (MKRS-HT) nanoclay is also used as synergist and a surface coating according to formulation "D" is used. The mechanical values and the flame resistance values correspond to the standard. The workability is considerably improved.

Examples for Polypropylene with Organic Bromine Flameproofing

0) Basic formulation as zero sample
Formulation:

|  |  |
|---|---|
| PP 8400 | 63% |
| Pentabromodiphenyl ether | 12% |
| Antimony trioxide | 5% |
| Mica | 20% |

Results:

|  |  |
|---|---|
| TS: | 23.6 |
| EL: | 0.023 |
| a(n): | 15.5 |
| UL 94 V (1.6 mm): | V-2 |
| MFI (230/5): | 7 |

Comment:

This constitutes a polyolefin FR formulation which serves as comparison sample to the following formulation.

1)
Formulation:

|  |  |
|---|---|
| PP 8400 | 63% |
| Pentabromodiphenyl ether | 6% |

-continued

| | |
|---|---|
| Antimony trioxide | 2% |
| MKRS-HT | 29 |

Results:

| | |
|---|---|
| TS: | 25.8 |
| EL: | 0.17 |
| a(n) | without breakage (w. br.) |
| UL 94 V (1.6 mm): | V-0 |
| MFI (230/5): | 6 |

Interpretation:

With a halving of the load of organic halogen/antimony trioxide flameproofing system (in percent), the use of the MKRS-HT according to examples of the disclosure in place of mica results in a compound which achieves a V-0 in the fire test according to UL 94 vertical. In this connection the mechanical values are considerably better than those of the zero sample.

Examples for Polyamide

0) Basic formulation as zero sample
Formulation:

| | |
|---|---|
| PA B3L | 45% |
| MDH (H-7) | 55% |

Results:

| | |
|---|---|
| E-Mod: | 5000 |
| TS (TR): | 58 (58) |
| EL: | 0.023 |
| a(n): | 21 |
| UL 94 (3.2 mm): | V-0 |

Comment:

The PA B3L is an impact strength-modified model for a widely used "Engineering Plastic" PA, which is used inter alia in FR applications such as FI protective circuits. This formulation is regarded in the corresponding plastics industry as a flameproof polyamide reference standard.

1)
Formulation:

| | |
|---|---|
| PA B3L | 45% |
| MKRS-HT | 55% |

Results:

| | |
|---|---|
| TS: | 55 |
| TR: | 55 |
| EL: | 0.018 |
| E-Mod: | 4520 |
| a(n): | 19 |
| UL 94 V (3.2 mm): | V-2 |

Comment:

In this formulation modified carbonised RM (MKRS-HT) is used. The mechanical values correspond, the flame resistance value is poorer than the standard.

2)
Formulation:

| | |
|---|---|
| PA B3L | 45% |
| MKRS-HT | 55%, provided with the surface modification A |

Results:

| | |
|---|---|
| TS (TR): | 65 (65) |
| EL: | 0.09 |
| E-Mod: | 5600 |
| a(n): | 32 |
| UL 94 V (3.2 mm): | V-1; |
| (1.6 mm): | n.e. |

Comment:

In this formulation in addition to modified carbonised RM (MKRS-HT) "A" is used. The surface modification A especially improves the flame resistance of the compound quite considerably, although it still does not reach the level of the standard, but is already considerably better than that in formulation 1). In addition the mechanical characteristics also improve considerably, which is helpful for technically demanding applications.

3)
Formulation:

| | |
|---|---|
| PA B3L | 45% |
| MKRS-HT | 50% |
| Nanoclay | 5% |

The non-polymer components are provided with the surface modification "D".
Results:

| | |
|---|---|
| TS: | 63 |
| TR: | 63 |
| EL: | 0.29 |
| E-Mod: | 5500 |
| a(n): | 34 |
| UL 94 V (3.2 mm): | V-0; |
| (1.6 mm) | V-1 |

Comment:

In this formulation, in addition to modified carbonised red mud (MKRS-HT) synergist nanoclay and the surface modification according to formulation "D" is used. This compound formulation supplies an outstanding flame resistance, which allows a reduction in the wall thickness of the electrical components. In this case the mechanical values reach the industry standard.

DISCUSSION

Outstanding inorganic, halogen-free flameproofing agents can be obtained by rehydration and according to examples of the disclosure by recarbonization from red mud which is produced as a waste product when ATH is obtained from bauxite according to the Bayer process. Without chemical treatment red mud also shows a certain flame-retardanteffect, which is attributable to residues from gibbsite/boehmite or goethite and other synergistic effects in the red mud, but overall fluctuate to a greater or lesser extent, that is to say are undefined. Flame retardants with defined characteristics are produced only by rehydration and especially by recarbonization of RM.

The content of hydroxides/oxide hydroxides of the aluminum and iron is increased by rehydration. These products exhibit their flame-retardant action between approximately 220° C. and 350° C. Fe (II) carbonate which develops its flame-retardant effect between approximately 350° C. and 500° C. by decomposition in iron oxide and $CO_2$ is produced especially by recarbonization from red mud.

Thus flame retardants can be produced which either act in the temperature range between 350° C. to 500° C., that is to say they constitute high-temperature flame retardants, or they act in the temperature range between 220° C. and 350° C., that is to say they constitute low-temperature range flame retardants or by special conduct of the reaction or by mixing they cover both the low-temperature and also the high-temperature range and thus are active between 220° C. and 500° C.

Together with the substances otherwise still present in the red mud, such as silicates, aluminum silicates, $TiO_2$, etc. which likewise act specifically or synergistically, novel, cost-effective OHFR products are thus available which are tailored for each polymer. The products previously available on the market are ATH and MDH, which act between 180° C. and approximately 350° C. ATH covers the range from 180° C. to approximately 220° C., MDH as so-called "high-temperature flame retardant" covers the range up to 350° C. The products obtained from red mud by rehydration or according to examples of the disclosure by recarbonization cover, with one single product, temperature ranges between 220° C. and 350° C., 350° C. and 500° C. or 220° C. and 500° C.

The products produced from red mud can be subjected to both physical and also chemical changes. Physical changes are understood to be in particular the adjustment of the average particle size and the residual moisture content. The chemical changes include the adjustment of the proportion of "$Na_2O$-soluble" (water-soluble sodium compounds) as well as surface coatings with substances such as for example organosilanes, organotitanates, organozirconium aluminates, carboxylic acids, hydroxycarboxylic acid derivatives, softeners, oligomers, polymer precursors, polymers, ionomers, boric acid and the metal salt derivatives thereof, zinc stannates, zinc hydroxystannates or combinations thereof. Furthermore these products can be combined with synergists such as for example organoclays (nanoclays), tin compounds, boric acid, fluoropolymers (less than 5%) etc..

In the examples tests were carried out with the following polymers: EVA, PP, polyamide 6 and PVC. Tests were conducted by comparison with ATH, MDH and pentabromophenylether/antimony trioxide as zero samples. MKRS-HT or MR2S-NT/MKRS-H were used as products according to examples of the disclosure.

The following results could be achieved:
EVA

The formulations referred to in the examples resulted in compounds which produced very good mechanical values, outstanding values for the specific contact resistance and flameproofing values comparable to those of compounds provided with ATH. The compounds can be used in all W & C applications.

PVC

The formulation given in example 1) is improved in terms of its flameproofing values by comparison with the ATH-based standard.

PP

The formulation given in example 2) corresponds in its mechanical values and the flameproofing values to the standard.

In the case of PP provided with organic bromine flameproofing, in formulation 1) by comparison with the zero sample the quantity of pentabromodiphenyl ether/antimony oxide was halved and mica was omitted. For this purpose MKRS-HT was integrated. This formulation showed better mechanical characteristics and achieved the fire protection UL 94 vertical (VO).

PA

The formulation given in example 3) achieves mechanical values corresponding to the standard. The flame resistance is outstanding.

Thus overall it may be established that modified, carbonised red mud (MKRS-HT) or modified, rehydrated red mud (MR2S-NT) or mixtures of both for example by special process management or by mixing of MR2S-NT and MKRS-HT produce OHFR systems which correspond to a product of the technology previously covered by ATH and MDH. According to examples of the disclosure, with MKRS-HT an additional product is introduced into the market which is very suitable for the high-temperature range (350° C.-500° C.). Additionally the red mud matrix, into which the products MR2S-NT and/or MKRS-HT produced by modification are embedded, appears to shift the reaction intervals, in which hydroxides/oxide hydroxides of aluminum and iron act, into higher temperature ranges.

The surface modification of the siderite-optimized MKRS-HT variant is produced by excellent behavior in the water storage, i.e. practically no decrease in the specific contact resistance is observed. This is an extraordinary result for a mineral flameproofing agent.

Generally it may be established that with modified, carbonised and/or rehydrated red mud, i.e. with MKRS-HT or MR2S-NT or MKRS-HT/MR2S-NT OHFR systems tailored for each polymer can be found which are significantly more economical by comparison with products used in the past, but in this case comparable results can be achieved with regard to mechanical values and above all flameproofing. These OHFR systems can also be mixed with the products on the market, for example with ATH, MDH, brucite or huntite etc., in order to achieve or to emphasize special effects.

Furthermore, according to examples of the disclosure it may be established that red mud, modified, rehydrated and carbonised red mud and mixtures thereof can be substituted for barite in specific applications. Products equipped in this way then also exhibit a flame-retardant effect in addition to the "effect comparable to barite". Thus there is a dual effect. Examples of such applications are for example fenders.

Furthermore, according to examples of the disclosure it may be established that red mud, modified, rehydrated and carbonised red mud and mixtures thereof have a sound-insulating effect. Thus products which are equipped therewith also exhibit a sound-insulating effect in addition to the flame-retardant effect. Thus here too there is a dual effect.

Examples of such applications are for in particular plastics systems which are used in the construction industry.

Red mud, modified, rehydrated and carbonised red mud and mixtures thereof can also be added to mineral material systems for the purpose of sound insulation. Example in this case are gypsum plasterboards, screeds, concrete, etc. Important applications are in particular in the construction industry.

Surprisingly it has been found that modified red mud according to the invention has many advantages, which are set out below, by comparison with barite in the shielding of radioactivity and as weighting materials for drilling fluids.

A further, additional highly interesting application results from the desire to obtain an ecologically correct substitute for peat in so-called potting compost, which is largely resistant to wind erosion (high density!) and dehydration and also does not become moldy quickly due to ubiquitous spores, which in the case of conventional materials is a permanent nuisance and the restricts the growth of biomass.

The use of modified red mud is described below as shielding against radioactive radiation. Because of its high density which, as described in detail for the application as weighting material in drilling mud applications, can be further increased, the red mud modified according to examples of the disclosure can be used in other applications currently running with barite. In the literature it is described that iron compounds are very effective in particular as a shielding medium in the field of high-energy ionizing radiation. Also in (predominantly commercial boiling water) reactors a so-called "iron armor" is used as primary shielding, surrounded by a second casing made of barite concrete and an optional third "plate", for reasons of radiation protection. Already for a relatively long time both in Europe and also in the New World there has been an intensive search for a design for a final repository for highly radioactive waste from the nuclear industry in the broadest sense (both military, power generation and also medical origin). In this case for the sake of simplification there are two basic designs:
a) storage in a salt dome;
b) storage in granite mountains.

In a) there is a false assumption that in the long run a salt dome would have dissolved in the geology if there were water infiltrations there for example through the "gypsum dome" lying above it. Unfortunately this is not so.

In the variant b) this danger is likewise present. Consequently technically practicable and achievable precautions must be considered, as to how, in spite of possible water infiltrations caused by tectonic events, it might be possible with a high degree of probability to rule out the release of radioactive isotopes which, if water-soluble, could migrate into the ground water, as well as the emanation of radioactive gases (radon, krypton, . . . ) which would be capable of diffusing through porous rock formations to the surface.

The modified red mud according to the invention is surprisingly verysuitable for this purpose. The following characteristics contribute to the radiological shielding effect:
  in combination with so-called nanoclays (montmorillonite for example) the composite systems, which are either used as powder mixtures or as shaped bodies pressed out of powder or are compounded in water-absorbent so-called "super-adsorbent" polymer systems (i.e. polyacrylate derivatives), absorb water and build up a very high hydraulic pressure in the entire storage system which counteracts the permanent water ingress and stabilizes the entire system;
  additionally the very high BET surface area effects an absorption of released substances and in particular radioactive gases within the final repository system and consequently prevents the release of the hazardous substances into the biosphere, either as soluble isotopes in the (ground) water or also as radioactive gases into the atmosphere. Consequently in a plurality of preparation systems the compounds according to examples of the disclosure are predestined to be used as filling material in final repositories for highly radioactive as well as intermediate-level to low-level radioactive waste.

In addition to the aforementioned advantages of the use thereof, it is also advantageous that the compound according to examples of the disclosure and the preparations thereof as filling material are "recoverable" at any time and are in no way an obstacle to a later use of the final repository as a "mine" of recyclable material.

Furthermore the compounds according to examples of the disclosure and the preparation systems thereof are fully recyclable and in an emergency they can be separate at any time without major expenditure from the casings of the final repository in which the vitrified highly radioactive waste is placed.

Furthermore examples of the disclosure relates to the use of modified red mud for attenuation or shielding of electromagnetic radiation.

Radiation is understood to be the free propagation of energy in space. In this case a distinction is made between particle radiation and electromagnetic radiation. The former consists of charged or uncharged particles which have a mass and propagate more slowly than light. The latter, also referred to as photon radiation, consists of a periodically changing electrical and magnetic field. This includes in addition to the visible light, ultraviolet rays and thermal radiation, also X-ray, cosmic and gamma radiation. Electromagnetic radiation is characterized by wavelength, frequency and amplitude and its propagation speed amounts in a vacuum is approximately the speed of light.

If photon radiation impinges on matter it is attenuated by absorption or scattering. The attenuation of the radiation in exponential conformity with natural law enables a theoretically infinite range of radiation. In this case the attenuation takes place by formation of high-energy electrons, which can then interact with other atoms (photoelectric effect, Compton effect, pairing, conventional scattering).

The extent of the attenuation is generally dependent upon the body density, the atomic number of the atoms contained in the body and the body layer thickness.

Particle radiation or electromagnetic radiation, which is capable of removing electrons from atoms or molecules so that positively charged ions or molecule residues remain, is referred to as ionizing radiation.

The biological effect of ionizing radiation on tissue is based on changes to macromolecules, in particular DNA, in the cells. In this case direct radiation damage (stochastic and deterministic radiation damage as well as teratogenic effects of radiation) or indirect radiation damage (formation of damaging radicals) can occur. Tissue with a high cell turnover and high proliferation rate is particularly susceptible to radiation damage.

Radiation protection is therefore subject to statutory regulation in most countries and regulates the contact with ionizing radiation for protection the population and professionally exposed persons or exposed patients.

In this connection it has been established according to the disclosure that the compound according to examples of the disclosure exhibits an attenuating and/or shielding effect on electromagnetic radiation, in particular on x-rays and/or gamma rays.

In specific advantageous embodiments of the use according to the disclosure the electromagnetic radiation is in particular x-rays or gamma rays.

In other advantageous embodiments of the disclosure the modified red mud according to examples of the disclosure is used for example in imaging medical instruments.

Figure 10:
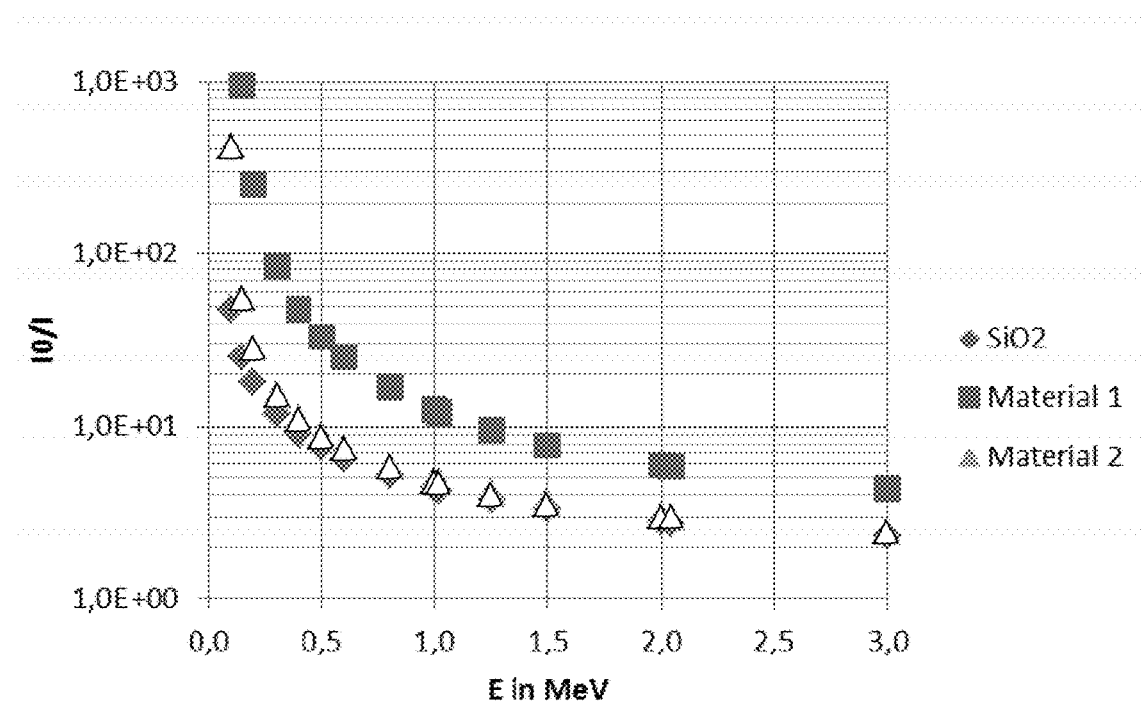
FIG. 10 shows a graphical representation of the energy dependence of the attenuation IO/I with respect to gamma rays for different materials.

FIG. 10 shows a graphical representation of the energy dependence of the attenuation IO/I with respect to gamma rays for different materials for a layer thickness of d=10 cm. Material 1-material according to table 4; material 2-iron (II) carbonate. For comparison SiO2 has been included in the representation.

TABLE 4

| Mineral | $\rho$ g/cm$^3$ | Material 1 m % | Material 2 m % | Reference material m % |
|---|---|---|---|---|
| SiO$_2$ | 2.30 | 7.5 | 0 | 100 |
| Al$_2$O$_3$ | 3.94 | 16 | 0 | 0 |
| Fe$_2$O$_3$ | 5.24 | 48 | 0 | 0 |
| TiO$_2$ | 4.24 | 11 | 0 | 0 |
| CaO | 3.37 | 3.7 | 0 | 0 |
| Na$_2$O | 2.27 | 4.0 | 0 | 0 |
| Cr$_2$O$_3$ | — | 0.37 | 0 | 0 |
| P$_2$O$_5$ | — | 0.41 | 0 | 0 |
| V$_2$O$_5$ | — | 0.24 | 0 | 0 |
| ZrO$_2$ | — | 0.32 | 0 | 0 |
| Mn$_2$O$_3$ | — | 0.06 | 0 | 0 |
| MgO | — | 0.06 | 0 | 0 |
| ZnO | — | 0.01 | 0 | 0 |
| Polymer | 1.0 | 10 | 10 | 0 |
| Fe(II)CO$_3$ | 3.8 | 0 | 90 | 0 |
| $\rho$ | — | 4.1 | 3.8 | 2.3 |

Table 4 shows the composition (in % by mass [m %]) of the materials 1 and 2 to be examined and of the reference material SiO$_2$. A calculated density of the material mixture is given in the last line.

In FIG. 10 the X axis is the selected energy range between 100 keV and 3 MeV. On the Y axis the ratio IM is the illustrated, which expresses the factor by which the intensity of the gamma rays impinging on an absorber of thickness d=10 cm is attenuated. In the low-energy range around 200 keV the attenuation is very great and for SiO$_2$, material 1 and 2 amounts to approximately 50, 50,000 and 500. The attenuation decreases as the energy of the gamma rays increases. In general it may be ascertained that the shielding effect of the material 1 is significantly better than that of the two other materials.

The use of modified red mud is described below as weighting material for drilling mud.

Currently barite (barium sulfate) is predominantly used as weighting material in drilling muds because of its density of >4.2 g/cm$^3$. In this case the accompanying substances present in the barite, often strontium and mercury compounds, are viewed critically. This is because later in the drilling process calcium carbonate in spite of its density which is low relative to barite must be used as weighting material, in order to enable its dissolution with acid in order to free the borehole wall. In this case the advantages of the material according to examples of the disclosure take effect. By the conduct of the reaction towards a maximum content of iron (II) carbonate in the compound according to examples of the disclosure the freeing of the borehole by release of the CO$_2$ with acid later in the drilling process is particularly advantageous. In this case the advantage of the compound according to examples of the disclosure, namely the high density of >4.5 g/cm$^3$, is maintained. As a result there is no need for the use of calcium carbonate as secondary weighting material. The environmental compatibility can be ensured by the production-based monitoring of the compound according to the disclosure. Since the compound according to examples of the disclosure is magnetic, completely new possibilities for separation of the weighting material from the "drilling fluid" are created. Due to the sintering process of the compound according to examples of the disclosure at relatively low temperatures the density increases from approximately 3.7 g/cm$^3$ to >4.5 g/cm$^3$.

The specific weight of the modified red mud according to examples of the disclosure is increased in that it is heated to a temperature of at least 150° C. and at most to a temperature of 350° C. in a slowly rotating, directly or indirectly heated rotary kiln in a non-oxidizing atmosphere during a transit time of between 1 and 2 hours. In this case for example the contained goethite (specific weight 4-4.1 g/cm$^3$) is partially or completely converted into hematite (specific weight 4.9-5.1 g/cm$^3$). The increased value of the specific weight of the modified red mud according to examples of the disclosure enables the direct substitution of barite in drilling fluid systems, wherein the particle size distribution and the specific surface area (according to BET) of the compounds according to the disclosure remain virtually unchanged. The specific weight of the modified red mud according to examples of the disclosure is 3.9 g/cm$^3$ and that of the compound according to examples of the disclosure increased in its specific weight to 4.65 g/cm$^3$ by means of the described process is determined by means of a Micrometrics gas pycnometer. A typical commercially available barite (for example GWE Pumpenbose GmbH, Germany) as weighting material for drilling fluid has, according to the data sheet, the specific weight of approximately 4.25 g/cm$^3$.

The load capacity of the drilling fluid is determined as TAZ by means of a Marsh funnel.

In a comparative test in a standard drilling fluid (1 m$^3$ water+30 kg bentonite+polymer+respective weighting material; adjusted to the density of 1.5 kg/L) for measuring the AZ (flow time) and the RAZ (residual flow time) the barite gave a AZ of 41 seconds, a RAZ of 32 seconds, and the compound according to examples of the disclosure increased in its specific weight gave a AZ of 39 seconds and a RAZ of 29 seconds.

The use of modified red mud is described below as a substrate analogous to earth.

The method often used nowadays for raising plants is the use of materials which contain more or less peat. This is very critical for reasons of the protection of this marshland habitat, since in Europe the highly endangered moors are still being drained for peat extraction and in the meantime there is even a threat of implementing corresponding plans in Russia. For these reasons the use of peat substrates is not sustainable and the available amount of peat is inevitably reduced from year to year. When considered worldwide, billions of tonnes of the raw material red mud for the compound according to the disclosure are available, so to speak, as waste.

The surprisingly discovered fertilizing effect of the modified red mud according to examples of the disclosure constitutes a further advantage for the described application.

Description of Tests:

(a) Soil Substrates

Soil from the Jülicher Bürde with 95 soil points (sugar beet quality)

Modified red mud according to examples of the disclosure

Red mud ex AOS-Stade, washed once

Floratorf potting compost (with 25% peat)

(b) Planters

AquaGreen 100 cm from EMSA, with water reservoir c) Watering

Completely desalinated water (millipore quality)

d) Test Plants

Leaf lettuce (*Lactua sativa* var. *Crispa*)

Opium poppy (*Papaver somniferum* ssp)

Quince (*Cydonia oblonga*)

Conduct of the plant test from the start of 2011 to October 2013:

The plant tests start with the introduction of the substrates into the planters, which are filled up to a level of 20 cm. Demineralized water is poured into the water reservoir at the bottom, until the display shows "full". The water is routinely checked and refilled. In this case the quantity of water added is such that the full water level is restored. Each two plant pots are provided with the same plants and every 3 months one plant is removed, checked visually and the height of growth is measured. The structure of the network of fine roots is compared and evaluated. The leaf lettuce seeds are, as specified on the seed packet, sown into the earth 15 cm apart in order to avoid root networks growing into one another for the purpose of easier evaluation. Then each is watered with 200 mL demineralized water. In the case of opium poppies, each poppy seed is pressed in to a depth of 1 cm and then water with 200 mL demineralized water. The stratified quince seeds are likewise sown 15 cm apart and 1 cm deep in the respective substrate. In the case of the quince plants, which are perennial, exclusively the height of growth is measured. The opium poppy is biennial and the best results are achieved if sowing takes place in late summer of the preceding year takes place and the plant which has started is overwintered in the open. The leaf lettuce has a six to seven month growth period. The planters were placed in the open in semi-shade with an east to south-east orientation and were not moved during the test. The measured values for the respective substrates and the three plant types can be seen from the following tables.

Result:

The compounds according to examples of the disclosure prove to be the most suitable substrates for the three tested plant types.

1st test
Leaf lettuce (*Lactua sativa* var. Crispa)

|  | Sugar beet soil | AOS red mud washed once | FLORATORF potting soil | Modified red mud |
|---|---|---|---|---|
| May 2013 | ~2 cm | ~2 cm | ~2 cm | ~2 cm |
| June 2013 | ~6 cm | ~4 cm | ~4 cm | ~7 cm |
| July 2013 | ~29 cm | ~25 cm | ~27 cm | ~30 cm |
| August 2013 | ~48 cm * | ~35 cm * | ~35 cm * | ~60 cm * |
| September 2013 | ~55 cm | ~45 cm | ~40 cm | ~75 cm |
| October 2013 | Harvest | Harvest | Harvest | Harvest |

The seeds were already sown at the start of April, but only sprouted in May, presumably because of the cold weather

* very many lateral leaves sprout on the stem.

2nd test
Quince (*Cydonia oblonga*)

| Start of 2011 | Sugar beet soil | AOS red mud washed once | FLORATORF potting soil | Modified red mud |
|---|---|---|---|---|
| June 2012 | ~10 cm | ~8 cm | ~7 cm | ~12 cm |
| October 2012 | ~15 cm | ~14 cm | ~12 cm | ~20 cm |
| April 2013 | ~50 cm | ~30 cm | ~28 cm | ~68 cm |
| May 2013 | ~52 cm | ~35 cm | ~29 cm | ~75 cm |
| June 2013 | ~60 cm | ~42 cm | ~35 cm | ~80 cm |
| July 2013 | ~66 cm | ~45 cm | ~37 cm | ~85 cm |
| August 2013 | ~70 cm | ~50 cm | ~40 cm | ~88 cm |
| September 2013 | ~78 cm | ~52 cm | ~42 cm | ~92 cm |
| October 2013 | ~83 cm | ~58 cm | ~44 cm | ~100 cm |

From the overall impression are the quince trees in the sugar beet soil and the modified red mud have shown the most balanced growth, which reflects the number 12 of branches, plant height and number of leaves.

3rd test
Opium poppy (*Papaver somniferum* ssp)

|  | Sugar beet soil | AOS red mud washed once | FLORATORF potting soil | Modified red mud |
|---|---|---|---|---|
| August 2012 | ~2.5-3 cm | ~2-2.5 cm | ~1.8-2.2 cm | ~3 cm |
| November 2012 | ~12-15 cm | ~11-13 cm | ~10 cm | ~15-18 cm |
| March 2013 | " | " | " | " |
| April 2013 | ~45 cm | ~32 cm | ~28 cm | ~50 cm |
| May 2013 | ~75 cm | ~70 cm | ~53-55 cm | ~88-90 cm |
| June 2013 | ~115 cm | ~90 cm | ~74 cm | ~142 cm |
| July 2013 "flowering" | ~140 cm | ~110 cm | ~92 cm | 162 cm |
| August 2013 | ~155 cm | ~128 cm | ~106 cm | ~178 cm |
| Average yield of poppy seeds In mg | ~1300 | ~900 | ~700 | ~1600 |

-continued

3rd test
Opium poppy (*Papaver somniferum* ssp)

| | Sugar beet soil | AOS red mud washed once | FLORATORF potting soil | Modified red mud |
|---|---|---|---|---|
| Harvesting height of the plant In September 2013 (standing | 150 cm | 115 cm | 100 cm | 175 cm |
| Capsule diameter in mm | 40-42.5 | 30-32 | 19-22 | 43-45 |

The plants on the sugar beet soil and on the compound according to an example of the disclosure had the largest and fullest flowers, with the colors varying from white through pink and dark red to dark violet.

The invention claimed is:

1. A modified, carbonised red mud (MKRS-HT) with a mineral composition of
   10 to 50% by weight of iron compounds,
   12 to 35% by weight of aluminum compounds,
   5 to 17% by weight of silicon compounds,
   2 to 10% by weight of titanium dioxide,
   0.5 to 6% by weight of calcium compounds,
characterized in that the weight ratio of Fe (II) carbonate to the oxides of iron is at least 1.

2. A modified, carbonised and rehydrated red mud with a mineral composition of
   10 to 50% by weight of iron compounds,
   12 to 35% by weight of aluminum compounds,
   5 to 17% by weight of silicon compounds,
   2 to 10% by weight of titanium dioxide,
   0.5 to 6% by weight of calcium compounds,
characterized in that the weight ratio of Fe (II) carbonate to the oxides of iron is at least 1, and the weight ratio of the sum of iron hydroxide and iron oxide hydroxide to the oxides of iron is at least 1.

3. The modified red mud according to claim 1, wherein the proportion of water-soluble sodium compounds, expressed in percentage by weight of Na2O is no more than 0.03% by weight.

4. The modified red mud according to claim 1, wherein the average particle size (d50) is no more than 50 μm.

5. The modified red mud according to claim 1, wherein the residual moisture content is no more than 0.4% by weight.

6. The modified red mud according to claim 1, wherein the surface thereof is provided with at least one substance which improves the compatibility of the particles of the modified red mud with a polymer matrix.

7. The modified red mud according to claim 6, wherein the substance is a surface modifying agent, selected from the group consisting of organosilanes, organotitanates, organozirconium aluminates, carboxylic acid derivatives, softeners, oligomer and polymer precursors, ionomers, boric acid and the metal salts and derivatives thereof, zinc stannates, zinc hydroxystannates or combinations thereof.

8. The modified red mud according to claim 7, wherein it is present in combination with synergists.

9. The modified red mud according to claim 8, wherein it also contains at least one further flame-retardant additive in a proportion up to 70% by weight.

10. The modified red mud according to claim 9, wherein at least one of the further flame retardant additives is an endothermally reacting substance.

11. A method for producing a modified red mud according to claim 1, comprising the steps of:
    a) providing red mud,
    b) reducing the iron (III) compounds contained in the red mud in acidic solution to iron (II) compounds, and
    c) adding a carbonate compound to the solution containing iron (II) compounds obtained in step b), wherein iron (II) carbonate (siderite) is formed.

12. A method for producing a modified red mud according to claim 1, comprising the steps of:
    a) providing red mud,
    b) separately producing iron (II) carbonate from available starting substances;
    c) mixing red mud and iron (II) carbonate; and
    d) obtaining modified carbonised red mud (MKRS-HT).

13. The modified red mud according to claim 1, wherein the modified red mud has been thermally treated in order to increase the specific weight.

14. The modified red mud according to claim 13, wherein the modified red mud has been thermally treated at a temperature of 150 to 350° C. and/or wherein the specific weight of the modified red mud is greater than 4 g/cm$^3$.

15. The modified red mud according to claim 1, wherein the specific surface area of the modified red mud is in the range from 2 to 200 m$^2$/g (measured according to BET).

16. The modified red mud according to claim 1, wherein the particle size of the modified red mud is less than 10 mm.

17. The modified red mud according to claim 1, wherein the bulk density (un-tamped bulk density, UTBD) of the modified red mud is in the range from 100 g/L to 3000 g/L.

18. The modified red mud according to claim 1, wherein the modified red mud is present in powdered form, in granular form and/or as a shaped body.

19. The modified red mud according to claim 1 wherein compounds of iron have a hydroxide and oxide hydroxide fraction of greater/equal to 50% by weight, and wherein the compounds of aluminum have a hydroxide and oxide hydroxide fraction of greater/equal to 50% by weight.

* * * * *